US012129168B2

(12) United States Patent
Costa et al.

(10) Patent No.: US 12,129,168 B2
(45) Date of Patent: Oct. 29, 2024

(54) MICROELECTRONICS PACKAGE WITH VERTICALLY STACKED MEMS DEVICE AND CONTROLLER DEVICE

(71) Applicant: Qorvo US, Inc., Greensboro, NC (US)

(72) Inventors: Julio C. Costa, Oak Ridge, NC (US); Mickael Renault, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/102,957

(22) Filed: Nov. 24, 2020

(65) Prior Publication Data

US 2021/0188624 A1   Jun. 24, 2021

Related U.S. Application Data

(60) Provisional application No. 62/952,988, filed on Dec. 23, 2019.

(51) Int. Cl.
*B81B 7/00* (2006.01)
*B81C 3/00* (2006.01)

(52) U.S. Cl.
CPC ............. *B81B 7/007* (2013.01); *B81C 3/001* (2013.01); *B81B 2203/0315* (2013.01);
(Continued)

(58) Field of Classification Search
CPC ............. B81C 3/001; B81C 1/00238; B81C 2203/037; B81C 2203/036; B81C 2203/0792; B81B 7/007; B81B 2203/0315; B81B 2207/096; B81B 2207/098; B81B 2207/012; B81B 2201/014
(Continued)

(56) References Cited

U.S. PATENT DOCUMENTS 4,093,562 A   6/1978   Kishimoto
4,366,202 A   12/1982  Borovsky
(Continued)

FOREIGN PATENT DOCUMENTS

CN   1256300 A   6/2000
CN   1696231 A   11/2005
(Continued)

OTHER PUBLICATIONS

US 10,896,908 B2, 01/2021, Costa et al. (withdrawn)
(Continued)

*Primary Examiner* — Hrayr A Sayadian
(74) *Attorney, Agent, or Firm* — Withrow & Terranova, P.L.L.C.

(57) ABSTRACT

The present disclosure relates to a microelectronics package with a vertically stacked structure of a microelectromechanical systems (MEMS) device and a controller device. The MEMS device includes a MEMS component, a MEMS through-via, and a MEMS connecting layer configured to electrically connect the MEMS component with the MEMS through-via. The controller device includes a controlling component, a controller through-via, and a controller connecting layer configured to electrically connect the controlling component with the controller through-via. The controller through-via is in contact with the MEMS through-via, such that the controlling component in the controller device is configured to control the MEMS component in the MEMS device.

24 Claims, 26 Drawing Sheets

(52) U.S. Cl.
CPC ... *B81B 2207/012* (2013.01); *B81B 2207/096* (2013.01); *B81B 2207/098* (2013.01); *B81C 2203/037* (2013.01); *B81C 2203/0792* (2013.01)

(58) Field of Classification Search
USPC ........................................................ 257/252
See application file for complete search history.

(56) References Cited

U.S. PATENT DOCUMENTS

| | | |
|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,164,687 A | 11/1992 | Kurian et al. |
| 5,294,295 A | 3/1994 | Gabriel |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,137,125 A | 10/2000 | Costas et al. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzergald |
| 6,713,859 B1 | 3/2004 | Ma |
| 6,841,413 B2 | 1/2005 | Liu et al. |
| 6,864,156 B1 | 3/2005 | Conn |
| 6,864,540 B1 | 3/2005 | Divakaruni et al. |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,064,391 B1 | 6/2006 | Conn |
| 7,109,635 B1 | 9/2006 | McClure et al. |
| 7,183,172 B2 | 2/2007 | Lee et al. |
| 7,190,064 B2 | 3/2007 | Wakabayashi et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 | 7/2008 | Hatano et al. |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,723,838 B2 | 5/2010 | Takeuchi et al. |
| 7,749,882 B2 | 7/2010 | Kweon et al. |
| 7,790,543 B2 | 9/2010 | Abadeer et al. |
| 7,816,231 B2 | 10/2010 | Dyer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,955,955 B2 | 6/2011 | Lane et al. |
| 7,960,218 B2 | 6/2011 | Ma et al. |
| 8,004,089 B2 | 8/2011 | Jobetto |
| 8,183,151 B2 | 5/2012 | Lake |
| 8,299,633 B2 | 10/2012 | Su |
| 8,420,447 B2 | 4/2013 | Tay et al. |
| 8,503,186 B2 | 8/2013 | Lin et al. |
| 8,563,403 B1 | 10/2013 | Farooq et al. |
| 8,568,547 B2 | 10/2013 | Yamazaki et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,064,883 B2 | 6/2015 | Meyer et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,406,637 B2 | 8/2016 | Wakisaka et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,698,081 B2 | 7/2017 | Yu et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 10,727,212 B2 | 7/2020 | Moon et al. |
| 10,784,348 B2 | 9/2020 | Fanelli et al. |
| 10,882,740 B2 | 1/2021 | Costa et al. |
| 2001/0004131 A1 | 6/2001 | Masayuki et al. |
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1 | 2/2004 | Nguyen et al. |
| 2004/0093901 A1 | 5/2004 | Kim et al. |
| 2004/0164367 A1 | 8/2004 | Park |
| 2004/0166642 A1 | 8/2004 | Chen et al. |
| 2004/0173790 A1 | 9/2004 | Yeo et al. |
| 2004/0219765 A1 | 11/2004 | Reif et al. |
| 2004/0266159 A1 | 12/2004 | Gardecki et al. |
| 2005/0037595 A1 | 2/2005 | Nakahata |
| 2005/0077511 A1 | 4/2005 | Fitzgerald |
| 2005/0079686 A1 | 4/2005 | Aigner et al. |
| 2005/0212419 A1 | 9/2005 | Vazan et al. |
| 2005/0258447 A1 | 11/2005 | Oi et al. |
| 2005/0260842 A1 | 11/2005 | Kaltalioglu et al. |
| 2006/0009041 A1 | 1/2006 | Iyer et al. |
| 2006/0057782 A1 | 3/2006 | Gardes et al. |
| 2006/0099781 A1 | 5/2006 | Beaumont et al. |
| 2006/0105496 A1 | 5/2006 | Chen et al. |
| 2006/0108585 A1 | 5/2006 | Gan et al. |
| 2006/0110887 A1 | 5/2006 | Huang |
| 2006/0124961 A1 | 6/2006 | Sakaguchi et al. |
| 2006/0228074 A1 | 10/2006 | Lipson et al. |

(56) References Cited

U.S. PATENT DOCUMENTS

| | | |
|---|---|---|
| 2006/0261446 A1 | 11/2006 | Wood et al. |
| 2007/0020807 A1 | 1/2007 | Geefay et al. |
| 2007/0034910 A1 | 2/2007 | Shie |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0122943 A1 | 5/2007 | Foong et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0020513 A1 | 1/2008 | Jobetto |
| 2008/0050852 A1 | 2/2008 | Hwang et al. |
| 2008/0050901 A1 | 2/2008 | Kweon et al. |
| 2008/0087959 A1 | 4/2008 | Monfray et al. |
| 2008/0157303 A1 | 7/2008 | Yang |
| 2008/0164528 A1 | 7/2008 | Cohen et al. |
| 2008/0251927 A1 | 10/2008 | Zhao et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0230542 A1 | 9/2009 | Lin et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0105209 A1 | 4/2010 | Winniczek et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0018126 A1 | 1/2011 | Kling et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0133341 A1 | 6/2011 | Shimizu et al. |
| 2011/0171792 A1 | 7/2011 | Chang et al. |
| 2011/0227158 A1 | 9/2011 | Zhu |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0091520 A1 | 4/2012 | Nakamura |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2012/0313243 A1 | 12/2012 | Chang et al. |
| 2013/0001665 A1 | 1/2013 | Zhu et al. |
| 2013/0015429 A1 | 1/2013 | Hong et al. |
| 2013/0037929 A1 | 2/2013 | Essig et al. |
| 2013/0049205 A1 | 2/2013 | Meyer et al. |
| 2013/0082399 A1 | 4/2013 | Kim et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0221493 A1 | 8/2013 | Kim et al. |
| 2013/0241040 A1 | 9/2013 | Tojo et al. |
| 2013/0280826 A1 | 10/2013 | Scanlan et al. |
| 2013/0299871 A1 | 11/2013 | Mauder et al. |
| 2013/0334698 A1 | 12/2013 | Mohammed et al. |
| 2014/0015131 A1 | 1/2014 | Meyer et al. |
| 2014/0021583 A1 | 1/2014 | Lo et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0323064 A1 | 10/2014 | McCarthy |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0021754 A1 | 1/2015 | Lin et al. |
| 2015/0060956 A1 | 3/2015 | Chen |
| 2015/0060967 A1 | 3/2015 | Yokoyama et al. |
| 2015/0076713 A1 | 3/2015 | Tsai et al. |
| 2015/0097302 A1 | 4/2015 | Wakisaka et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0162307 A1 | 6/2015 | Chen et al. |
| 2015/0171006 A1 | 6/2015 | Hung et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0056544 A1 | 2/2016 | Garcia et al. |
| 2016/0079137 A1 | 3/2016 | Leipold et al. |
| 2016/0079233 A1 | 3/2016 | Deboy et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0141249 A1 | 5/2016 | Kang et al. |
| 2016/0141263 A1 | 5/2016 | Lin et al. |
| 2016/0155706 A1 | 6/2016 | Yoneyama et al. |
| 2016/0260745 A1 | 9/2016 | Huang et al. |
| 2016/0284568 A1 | 9/2016 | Morris et al. |
| 2016/0284570 A1 | 9/2016 | Morris et al. |
| 2016/0300771 A1 | 10/2016 | Lin |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0005000 A1 | 1/2017 | Beyne |
| 2017/0024503 A1 | 1/2017 | Connelly |
| 2017/0032957 A1 | 2/2017 | Costa et al. |

(56) References Cited

U.S. PATENT DOCUMENTS

| | | |
|---|---|---|
| 2017/0033026 A1 | 2/2017 | Ho et al. |
| 2017/0053938 A1 | 2/2017 | Whitefield |
| 2017/0062284 A1 | 3/2017 | Mason et al. |
| 2017/0062366 A1 | 3/2017 | Enquist |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0042110 A1 | 2/2018 | Cok |
| 2018/0044169 A1 | 2/2018 | Hatcher, Jr. et al. |
| 2018/0044177 A1 | 2/2018 | Vandemeer et al. |
| 2018/0047653 A1* | 2/2018 | Costa ............... H01L 23/4334 |
| 2018/0076174 A1 | 3/2018 | Costa et al. |
| 2018/0138082 A1 | 5/2018 | Costa et al. |
| 2018/0138227 A1 | 5/2018 | Shimotsusa et al. |
| 2018/0145678 A1 | 5/2018 | Maxim et al. |
| 2018/0151461 A1 | 5/2018 | Cho |
| 2018/0166358 A1 | 6/2018 | Costa et al. |
| 2018/0240759 A1 | 8/2018 | Haji-Rahim et al. |
| 2018/0240797 A1 | 8/2018 | Yokoyama et al. |
| 2018/0261470 A1 | 9/2018 | Costa et al. |
| 2018/0269188 A1 | 9/2018 | Yu et al. |
| 2018/0277632 A1 | 9/2018 | Fanelli et al. |
| 2018/0331041 A1 | 11/2018 | Liao et al. |
| 2018/0342439 A1 | 11/2018 | Costa et al. |
| 2019/0013254 A1 | 1/2019 | Costa et al. |
| 2019/0013255 A1 | 1/2019 | Costa et al. |
| 2019/0043812 A1 | 2/2019 | Leobandung |
| 2019/0057922 A1 | 2/2019 | Costa et al. |
| 2019/0074263 A1 | 3/2019 | Costa et al. |
| 2019/0074271 A1 | 3/2019 | Costa et al. |
| 2019/0104653 A1 | 4/2019 | Jandzinski et al. |
| 2019/0172826 A1 | 6/2019 | Or-Bach et al. |
| 2019/0172842 A1 | 6/2019 | Whitefield |
| 2019/0189599 A1 | 6/2019 | Baloglu et al. |
| 2019/0229101 A1 | 7/2019 | Lee |
| 2019/0237421 A1 | 8/2019 | Tsuchiya |
| 2019/0287953 A1 | 9/2019 | Moon et al. |
| 2019/0288006 A1 | 9/2019 | Paul et al. |
| 2019/0304910 A1 | 10/2019 | Fillion |
| 2019/0304977 A1 | 10/2019 | Costa et al. |
| 2019/0312110 A1 | 10/2019 | Costa et al. |
| 2019/0326159 A1 | 10/2019 | Costa et al. |
| 2019/0378819 A1 | 12/2019 | Costa et al. |
| 2019/0378821 A1 | 12/2019 | Costa et al. |
| 2020/0006193 A1 | 1/2020 | Costa et al. |
| 2020/0027814 A1 | 1/2020 | Ichiryu et al. |
| 2020/0058541 A1 | 2/2020 | Konishi et al. |
| 2020/0115220 A1 | 4/2020 | Hammond et al. |
| 2020/0118838 A1 | 4/2020 | Hammond et al. |
| 2020/0176347 A1 | 6/2020 | Costa et al. |
| 2020/0234978 A1 | 7/2020 | Costa et al. |
| 2020/0235024 A1 | 7/2020 | Costa et al. |
| 2020/0235040 A1 | 7/2020 | Costa et al. |
| 2020/0235054 A1 | 7/2020 | Costa et al. |
| 2020/0235059 A1 | 7/2020 | Cok et al. |
| 2020/0235066 A1 | 7/2020 | Costa et al. |
| 2020/0235074 A1 | 7/2020 | Costa et al. |
| 2021/0134699 A1 | 5/2021 | Costa et al. |
| 2021/0167031 A1 | 6/2021 | Costa et al. |
| 2021/0183693 A1 | 6/2021 | Costa et al. |
| 2021/0188624 A1* | 6/2021 | Costa ............... B81C 1/00238 |
| 2021/0348078 A1 | 11/2021 | Haramoto et al. |

FOREIGN PATENT DOCUMENTS

| | | |
|---|---|---|
| CN | 101785098 A | 7/2010 |
| CN | 101901953 A | 12/2010 |
| CN | 102956468 A | 3/2013 |
| CN | 103000537 A | 3/2013 |
| CN | 103730429 A | 4/2014 |
| CN | 103811474 A | 5/2014 |
| CN | 103872012 A | 6/2014 |
| CN | 104134607 A | 11/2014 |
| CN | 106057747 A | 10/2016 |
| CN | 106098609 A | 11/2016 |
| CN | 106158786 A | 11/2016 |
| CN | 107481998 A | 12/2017 |
| DE | 102014117594 A1 | 6/2016 |
| EP | 1098386 A1 | 5/2001 |
| EP | 2862204 A1 | 4/2015 |
| EP | 2996143 A1 | 3/2016 |
| JP | S505733 Y1 | 2/1975 |
| JP | S5338954 A | 4/1978 |
| JP | H11-220077 A | 8/1999 |
| JP | 200293957 A | 3/2002 |
| JP | 2002100767 A | 4/2002 |
| JP | 2002252376 A | 9/2002 |
| JP | 2004273604 A | 9/2004 |
| JP | 2004327557 A | 11/2004 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2009200274 A | 9/2009 |
| JP | 2009302526 A | 12/2009 |
| JP | 2011216780 A | 10/2011 |
| JP | 2011243596 A | 12/2011 |
| JP | 2012129419 A | 7/2012 |
| JP | 2012156251 A | 8/2012 |
| JP | 2013162096 A | 8/2013 |
| JP | 2013222745 A | 10/2013 |
| JP | 2013254918 A | 12/2013 |
| JP | 2014509448 A | 4/2014 |
| TW | 201409612 A | 3/2014 |
| TW | 201448172 A | 12/2014 |
| TW | 201503315 A | 1/2015 |
| TW | 201705382 A | 2/2017 |
| TW | 201719827 A | 6/2017 |
| TW | 201724310 A | 7/2017 |
| TW | 201733056 A | 9/2017 |
| TW | 201738943 A | 11/2017 |
| TW | 201826332 A | 7/2018 |
| TW | 201834084 A | 9/2018 |
| TW | 201835971 A | 10/2018 |
| TW | 201839858 A | 11/2018 |
| TW | 201839870 A | 11/2018 |
| WO | 2007074651 A1 | 7/2007 |
| WO | 2010080068 A1 | 7/2010 |
| WO | 2015074439 A1 | 5/2015 |
| WO | 2018083961 A1 | 5/2018 |
| WO | 2018125242 A1 | 7/2018 |
| WO | 2018168391 A1 | 9/2018 |

OTHER PUBLICATIONS

Borel, S. et al., "Control of Selectivity between SiGe and Si in Isotropic Etching Processes," Japanese Journal of Applied Physics, vol. 43, No. 6B, 2004, pp. 3964-3966.

Non-Final Office Action for U.S. Appl. No. 16/427,019, mailed Dec. 2, 2021, 17 pages.

Corrected Notice of Allowability for U.S. Appl. No. 16/678,551, mailed Nov. 24, 2021, 3 pages.

Corrected Notice of Allowability for U.S. Appl. No. 16/678,551, mailed Jan. 27, 2022, 3 pages.

Corrected Notice of Allowability for U.S. Appl. No. 16/678,573, mailed Nov. 24, 2021, 3 pages.

Corrected Notice of Allowability for U.S. Appl. No. 16/678,573, mailed Jan. 27, 2022, 3 pages.

(56) References Cited

OTHER PUBLICATIONS

Final Office Action for U.S. Appl. No. 16/678,586, mailed Nov. 22, 2021, 15 pages.
Advisory Action for U.S. Appl. No. 16/678,586, mailed Jan. 26, 2022, 3 pages.
Corrected Notice of Allowability for U.S. Appl. No. 16/678,602, mailed Nov. 24, 2021, 4 pages.
Corrected Notice of Allowability for U.S. Appl. No. 16/678,602, mailed Dec. 30, 2021, 4 pages.
Decision of Rejection for Chinese Patent Application No. 201680058198.6, mailed Nov. 12, 2021, 6 pages.
Examination Report for European Patent Application No. 17755402.9, mailed Dec. 20, 2021, 12 pages.
Examination Report for European Patent Application No. 17755403.7, mailed Dec. 20, 2021, 13 pages.
Notice of Allowance for Japanese Patent Application No. 2019507767, mailed Jan. 19, 2021, 6 pages.
International Search Report and Written Opinion for International Patent Application No. PCT/US2021/043968, mailed Nov. 19, 2021, 15 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, mailed Jul. 18, 2013, 20 pages.
Final Office Action for U.S. Appl. No. 13/852,648, mailed Nov. 26, 2013, 21 pages.
Applicant-Initiated Interview Summary for U.S. Appl. No. 13/852,648, mailed Jan. 27, 2014, 4 pages.
Advisory Action for U.S. Appl. No. 13/852,648, mailed Mar. 7, 2014, 4 pages.
Notice of Allowance for U.S. Appl. No. 13/852,648, mailed Jun. 16, 2014, 9 pages.
Notice of Allowance for U.S. Appl. No. 13/852,648, mailed Sep. 26, 2014, 8 pages.
Notice of Allowance for U.S. Appl. No. 13/852,648, mailed Jan. 22, 2015, 8 pages.
Non-Final Office Action for U.S. Appl. No. 13/852,648, mailed Jun. 24, 2015, 20 pages.
Final Office Action for U.S. Appl. No. 13/852,648, mailed Oct. 22, 2015, 20 pages.
Non-Final Office Action for U.S. Appl. No. 13/852,648, mailed Feb. 19, 2016, 12 pages.
Final Office Action for U.S. Appl. No. 13/852,648, mailed Jul. 20, 2016, 14 pages.
Non-Final Office Action for U.S. Appl. No. 14/315,765, mailed Jan. 2, 2015, 6 pages.
Final Office Action for U.S. Appl. No. 14/315,765, mailed May 11, 2015, 17 pages.
Advisory Action for U.S. Appl. No. 14/315,765, mailed Jul. 22, 2015, 3 pages.
Non-Final Office Action for U.S. Appl. No. 14/260,909, mailed Mar. 20, 2015, 20 pages.
Final Office Action for U.S. Appl. No. 14/260,909, mailed Aug. 12, 2015, 18 pages.
Non-Final Office Action for U.S. Appl. No. 14/261,029, mailed Dec. 5, 2014, 15 pages.
Notice of Allowance for U.S. Appl. No. 14/261,029, mailed Apr. 27, 2015, 10 pages.
Corrected Notice of Allowability for U.S. Appl. No. 14/261,029, mailed Nov. 17, 2015, 5 pages.
Non-Final Office Action for U.S. Appl. No. 14/529,870, mailed Feb. 12, 2016, 14 pages.
Notice of Allowance for U.S. Appl. No. 14/529,870, mailed Jul. 15, 2016, 8 pages.
Non-Final Office Action for U.S. Appl. No. 15/293,947, mailed Apr. 7, 2017, 12 pages.
Notice of Allowance for U.S. Appl. No. 15/293,947, mailed Aug. 14, 2017, 7 pages.
Non-Final Office Action for U.S. Appl. No. 14/715,830, mailed Apr. 13, 2016, 16 pages.
Final Office Action for U.S. Appl. No. 14/715,830, mailed Sep. 6, 2016, 13 pages.
Advisory Action for U.S. Appl. No. 14/715,830, mailed Oct. 31, 2016, 6 pages.
Notice of Allowance for U.S. Appl. No. 14/715,830, mailed Feb. 10, 2017, 8 pages.
Notice of Allowance for U.S. Appl. No. 14/715,830, mailed Mar. 2, 2017, 8 pages.
Non-Final Office Action for U.S. Appl. No. 14/851,652, mailed Oct. 7, 2016, 10 pages.
Notice of Allowance for U.S. Appl. No. 14/851,652, mailed Apr. 11, 2017, 9 pages.
Corrected Notice of Allowance for U.S. Appl. No. 14/851,652, mailed Jul. 24, 2017, 6 pages.
Corrected Notice of Allowance for U.S. Appl. No. 14/851,652, mailed Sep. 6, 2017, 5 pages.
Notice of Allowance for U.S. Appl. No. 14/959,129, mailed Oct. 11, 2016, 8 pages.
Non-Final Office Action for U.S. Appl. No. 15/173,037, mailed Jan. 10, 2017, 8 pages.
Final Office Action for U.S. Appl. No. 15/173,037, mailed May 2, 2017, 13 pages.
Advisory Action for U.S. Appl. No. 15/173,037, mailed Jul. 20, 2017, 3 pages.
Notice of Allowance for U.S. Appl. No. 15/173,037, mailed Aug. 9, 2017, 7 pages.
Non-Final Office Action for U.S. Appl. No. 15/085,185, mailed Feb. 15, 2017, 10 pages.
Non-Final Office Action for U.S. Appl. No. 15/085,185, mailed Jun. 6, 2017, 5 pages.
Non-Final Office Action for U.S. Appl. No. 15/229,780, mailed Jun. 30, 2017, 12 pages.
Non-Final Office Action for U.S. Appl. No. 15/262,457, mailed Aug. 7, 2017, 10 pages.
Notice of Allowance for U.S. Appl. No. 15/408,560, mailed Sep. 25, 2017, 8 pages.
Notice of Allowance for U.S. Appl. No. 15/287,202, mailed Aug. 25, 2017, 11 pages.
Non-Final Office Action for U.S. Appl. No. 15/353,346, mailed May 23, 2017, 15 pages.
Notice of Allowance for U.S. Appl. No. 15/353,346, mailed Sep. 25, 2017, 9 pages.
Notice of Allowance for U.S. Appl. No. 16/426,527, mailed May 14, 2021, 9 pages.
Final Office Action for U.S. Appl. No. 16/427,019, mailed May 21, 2021, 16 pages.
Advisory Action for U.S. Appl. No. 16/427,019, mailed Aug. 2, 2021, 3 pages.
Final Office Action and Examiner-Initiated Interview Summary for U.S. Appl. No. 16/678,551, mailed Jun. 28, 2021, 9 pages.
Final Office Action and Examiner-Initiated Interview Summary for U.S. Appl. No. 16/678,573, mailed Jun. 28, 2021, 10 pages.
Notice of Allowance for U.S. Appl. No. 16/678,619, mailed Jul. 8, 2021, 10 pages.

(56) References Cited

OTHER PUBLICATIONS

Final Office Action for U.S. Appl. No. 16/678,602, mailed Jun. 1, 2021, 9 pages.
Notice of Reasons for Refusal for Japanese Patent Application No. 2020119130, mailed Jun. 29, 2021, 4 pages.
Notice of Reasons for Rejection for Japanese Patent Application No. 2019507765, mailed Jun. 28, 2021, 4 pages.
Search Report for Japanese Patent Application No. 2019507768, mailed Jul. 15, 2021, 42 pages.
Notice of Reasons for Refusal for Japanese Patent Application No. 2019507768, mailed Jul. 26, 2021, 4 pages.
Reasons for Rejection for Japanese Patent Application No. 2019507767, mailed Jun. 25, 2021, 5 pages.
International Preliminary Report on Patentability for International Patent Application No. PCT/US2019/063460, mailed Jun. 10, 2021, 9 pages.
International Preliminary Report on Patentability for International Patent Application No. PCT/US2019/034699, mailed Aug. 5, 2021, 9 pages.
International Preliminary Report on Patentability for International Patent Application No. PCT/US2020/014662, mailed Aug. 5, 2021, 11 pages.
International Preliminary Report on Patentability for International Patent Application No. PCT/US2020/014665, mailed Aug. 5, 2021, 10 pages.
International Preliminary Report on Patentability for International Patent Application No. PCT/US2020/014666, mailed Aug. 5, 2021, 11 pages.
International Preliminary Report on Patentability for International Patent Application No. PCT/US2020/014667, mailed Aug. 5, 2021, 8 pages.
International Preliminary Report on Patentability for International Patent Application No. PCT/US2020/014669, mailed Aug. 5, 2021, 9 pages.
Advisory Action for U.S. Appl. No. 16/390,496, mailed Mar. 1, 2021, 3 pages.
Notice of Allowance for U.S. Appl. No. 16/390,496, mailed Apr. 5, 2021, 7 pages.
Non-Final Office Action for U.S. Appl. No. 16/678,551, mailed Apr. 7, 2021, 9 pages.
Applicant-Initiated Interview Summary for U.S. Appl. No. 16/678,573, mailed May 7, 2021, 2 pages.
Supplementary Examination Report for Singapore Patent Application No. 11201901194S, mailed Mar. 10, 2021, 3 pages.
International Preliminary Report on Patentability for International Patent Application No. PCT/US2019/055317, mailed Apr. 22, 2021, 11 pages.
International Preliminary Report on Patentability for International Patent Application No. PCT/US2019/055321, mailed Apr. 22, 2021, 14 pages.
Office Action for Taiwanese Patent Application No. 108140788, mailed Mar. 25, 2021, 18 pages.
Non-Final Office Action for U.S. Appl. No. 16/527,702, mailed Jan. 10, 2020, 10 pages.
Office Action for Japanese Patent Application No. 2018-526613, mailed Nov. 5, 2019, 8 pages.
Intention to Grant for European Patent Application No. 17757646.9, mailed Feb. 27, 2020, 55 pages.
International Search Report and Written Opinion for International Patent Application No. PCT/US2019/034645, mailed Sep. 19, 2019, 14 pages.
International Search Report and Written Opinion for International Patent Application No. PCT/US2019/063460, mailed Feb. 25, 2020, 14 pages.
International Search Report and Written Opinion for International Patent Application No. PCT/US2019/055317, mailed Feb. 6, 2020, 17 pages.
International Search Report and Written Opinion for International Patent Application No. PCT/US2019/055321, mailed Jan. 27, 2020, 23 pages.
International Search Report and Written Opinion for International Patent Application No. PCT/US2019/034699, mailed Oct. 29, 2019, 13 pages.
Corrected Notice of Allowability for U.S. Appl. No. 15/695,579, mailed Apr. 1, 2020, 4 pages.
Final Office Action for U.S. Appl. No. 16/204,214, mailed Mar. 6, 2020, 14 pages.
Notice of Allowance for U.S. Appl. No. 15/816,637, mailed Apr. 2, 2020, 8 pages.
Notice of Allowance for U.S. Appl. No. 16/527,702, mailed Apr. 9, 2020, 8 pages.
Decision of Rejection for Japanese Patent Application No. 2015-180657, mailed Mar. 17, 2020, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, mailed Apr. 15, 2020, 9 pages.
Notice of Allowance for U.S. Appl. No. 16/004,961, mailed Apr. 30, 2020, 8 pages.
Advisory Action for U.S. Appl. No. 16/204,214, mailed Apr. 15, 2020, 3 pages.
Examination Report for European Patent Application No. 16751791.1, mailed Apr. 30, 2020, 15 pages.
Notification of Reasons for Refusal for Japanese Patent Application No. 2018-526613, mailed May 11, 2020, 5 pages.
Notice of Allowance for U.S. Appl. No. 15/873,152, mailed May 11, 2020, 8 pages.
Non-Final Office Action for U.S. Appl. No. 16/454,687, mailed May 15, 2020, 14 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Zeng, X. et al., "A Combination of Boron Nitride Nanotubes and Cellulose Nanofibers for the Preparation of A Nanocomposite with High Thermal Conductivity," ACS Nano, vol. 11, No. 5, 2017, American Chemical Society, pp. 5167-5178.
Quayle Action for U.S. Appl. No. 16/703,251, mailed Jun. 26, 2020, 5 pages.
Corrected Notice of Allowability for U.S. Appl. No. 15/695,579, mailed May 20, 2020, 4 pages.
Notice of Allowability for U.S. Appl. No. 15/695,579, mailed Jun. 25, 2020, 4 pages.
Notice of Allowance for U.S. Appl. No. 16/368,210, mailed Jun. 17, 2020, 10 pages.
Non-Final Office Action for U.S. Appl. No. 16/374,125, mailed Jun. 26, 2020, 12 pages.
Non-Final Office Action for U.S. Appl. No. 16/390,496, mailed Jul. 10, 2020, 17 pages.
Non-Final Office Action for U.S. Appl. No. 16/204,214, mailed May 19, 2020, 15 pages.
Non-Final Office Action for U.S. Appl. No. 16/454,809, mailed May 15, 2020, 12 pages.
Examination Report for Singapore Patent Application No. 11201901193U, mailed May 26, 2020, 6 pages.
International Search Report and Written Opinion for International Patent Application No. PCT/US2020/014662, mailed May 7, 2020, 18 pages.
International Search Report and Written Opinion for International Patent Application No. PCT/US2020/014665, mailed May 13, 2020, 17 pages.
International Search Report and Written Opinion for International Patent Application No. PCT/US2020/014666, mailed Jun. 4, 2020, 18 pages.
International Search Report and Written Opinion for International Patent Application No. PCT/US2020/014667, mailed May 18, 2020, 14 pages.
International Search Report and Written Opinion for International Patent Application No. PCT/US2020/014669, mailed Jun. 4, 2020, 15 pages.
Notice of Allowance for U.S. Appl. No. 16/454,687, mailed Aug. 14, 2020, 7 pages.

(56) References Cited

OTHER PUBLICATIONS

Decision to Grant for Japanese Patent Application No. 2018-526613, mailed Aug. 17, 2020, 5 pages.
Final Office Action for U.S. Appl. No. 16/454,809, mailed Aug. 21, 2020, 12 pages.
Von Trapp, F., "Hybrid Bonding: From Concept to Commercialization," Apr. 2, 2018, 3D InCities, https://www.3dincites.com/2018/04/hybrid-bonding-from-concept-to-commercialization/, 10 pages.
Notice of Allowance for U.S. Appl. No. 16/703,251, mailed Aug. 27, 2020, 8 pages.
Notice of Allowance for U.S. Appl. No. 16/527,702, mailed Nov. 13, 2020, 8 pages.
Notice of Allowance for U.S. Appl. No. 16/374,125, mailed Dec. 16, 2020, 9 pages.
Final Office Action for U.S. Appl. No. 16/390,496, mailed Dec. 24, 2020, 21 pages.
Non-Final Office Action for U.S. Appl. No. 16/426,527, mailed Nov. 20, 2020, 7 pages.
Final Office Action for U.S. Appl. No. 16/204,214, mailed Nov. 30, 2020, 15 pages.
Notice of Allowance for U.S. Appl. No. 16/204,214, mailed Feb. 17, 2021, 11 pages.
Advisory Action for U.S. Appl. No. 16/454,809, mailed Oct. 23, 2020, 3 pages.
Notice of Allowance for U.S. Appl. No. 15/287,273, mailed Jun. 30, 2017, 8 pages.
Corrected Notice of Allowability for U.S. Appl. No. 15/287,273, mailed Jul. 21, 2017, 5 pages.
Supplemental Notice of Allowability for U.S. Appl. No. 15/287,273, mailed Sep. 7, 2017, 5 pages.
Extended European Search Report for European Patent Application No. 15184861.1, mailed Jan. 25, 2016, 6 pages.
Office Action of the Intellectual Property Office for Taiwanese Patent Application No. 104130224, mailed Jun. 15, 2016, 9 pages.
Non-Final Office Action for U.S. Appl. No. 14/885,202, mailed Apr. 14, 2016, 5 pages.
Final Office Action for U.S. Appl. No. 14/885,202, mailed Sep. 27, 2016, 7 pages.
Advisory Action for U.S. Appl. No. 14/885,202, mailed Nov. 29, 2016, 3 pages.
Notice of Allowance for U.S. Appl. No. 14/885,202, mailed Jan. 27, 2017, 7 pages.
Notice of Allowance for U.S. Appl. No. 14/885,202, mailed Jul. 24, 2017, 8 pages.
Notice of Allowance for U.S. Appl. No. 14/885,243, mailed Aug. 31, 2016, 8 pages.
Non-Final Office Action for U.S. Appl. No. 12/906,689, mailed May 27, 2011, 13 pages.
Non-Final Office Action for U.S. Appl. No. 12/906,689, mailed Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, mailed Oct. 7, 2016, 11 pages.
Non-Final Office Action for U.S. Appl. No. 15/652,867, mailed Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud AL et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, mailed Nov. 27, 2017, 17 pages.
International Search Report and Written Opinion for PCT/US2017/046758, mailed Nov. 16, 2017, 19 pages.
International Search Report and Written Opinion for PCT/US2017/046779, mailed Nov. 29, 2017, 17 pages.
Non-Final Office Action for U.S. Appl. No. 15/616,109, mailed Oct. 23, 2017, 16 pages.
Corrected Notice of Allowability for U.S. Appl. No. 14/851,652, mailed Oct. 20, 2017, 5 pages.
Final Office Action for U.S. Appl. No. 15/262,457, mailed Dec. 19, 2017, 12 pages.
Supplemental Notice of Allowability and Applicant-Initiated Interview Summary for U.S. Appl. No. 15/287,273, mailed Oct. 18, 2017, 6 pages.
Supplemental Notice of Allowability for U.S. Appl. No. 15/287,273, mailed Nov. 2, 2017, 5 pages.
Non-Final Office Action for U.S. Appl. No. 15/491,064, mailed Jan. 2, 2018, 9 pages.
Notice of Allowance for U.S. Appl. No. 14/872,910, mailed Nov. 17, 2017, 11 pages.
Notice of Allowance for U.S. Appl. No. 15/648,082, mailed Nov. 29, 2017, 8 pages.
Non-Final Office Action for U.S. Appl. No. 15/652,826, mailed Nov. 3, 2017, 5 pages.
Notice of Allowance for U.S. Appl. No. 15/229,780, mailed Oct. 3, 2017, 7 pages.
Supplemental Notice of Allowability for U.S. Appl. No. 15/287,273, mailed Jan. 17, 2018, 5 pages.
Notice of Allowance for U.S. Appl. No. 15/498,040, mailed Feb. 20, 2018, 8 pages.
Non-Final Office Action for U.S. Appl. No. 15/387,855, mailed Jan. 16, 2018, 7 pages.
Non-Final Office Action for U.S. Appl. No. 15/795,915, mailed Feb. 23, 2018, 6 pages.
International Preliminary Report on Patentability for PCT/US2016/045809, mailed Feb. 22, 2018, 8 pages.
Advisory Action and Applicant-Initiated Interview Summary for U.S. Appl. No. 15/262,457, mailed Feb. 28, 2018, 5 pages.
Supplemental Notice of Allowability for U.S. Appl. No. 15/287,273, mailed Feb. 23, 2018, 5 pages.
Non-Final Office Action for U.S. Appl. No. 15/676,415, mailed Mar. 27, 2018, 14 page.
Non-Final Office Action for U.S. Appl. No. 15/676,621, mailed Mar. 26, 2018, 16 pages.
Notice of Allowance for U.S. Appl. No. 15/795,915, mailed Jun. 15, 2018, 7 pages.
Final Office Action for U.S. Appl. No. 15/387,855, mailed May 24, 2018, 9 pages.
Non-Final Office Action for U.S. Appl. No. 15/262,457, mailed Apr. 19, 2018, 10 pages.
Notice of Allowance for U.S. Appl. No. 15/491,064, mailed Apr. 30, 2018, 9 pages.
Non-Final Office Action for U.S. Appl. No. 15/601,858, mailed Jun. 26, 2018, 12 pages.
Notice of Allowance for U.S. Appl. No. 15/616,109, mailed Jul. 2, 2018, 7 pages.
Notice of Allowance for U.S. Appl. No. 15/676,621, mailed Jun. 5, 2018, 8 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.

(56) References Cited

OTHER PUBLICATIONS

Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#/the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.

Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology On SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.

(56) References Cited

OTHER PUBLICATIONS

Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 15/676,693, mailed May 3, 2018, 14 pages.
Notice of Allowance for U.S. Appl. No. 15/789,107, mailed May 18, 2018, 8 pages.
Final Office Action for U.S. Appl. No. 15/616,109, mailed Apr. 19, 2018, 18 pages.
Notice of Allowance for U.S. Appl. No. 15/676,693, mailed Jul. 20, 2018, 8 pages.
Notice of Allowance for U.S. Appl. No. 15/695,629, mailed Jul. 11, 2018, 12 pages.
Notice of Allowance for U.S. Appl. No. 15/387,855, mailed Aug. 10, 2018, 7 pages.
Notice of Allowance for U.S. Appl. No. 15/914,538, mailed Aug. 1, 2018, 9 pages.
Notice of Allowance and Applicant-Initiated Interview Summary for U.S. Appl. No. 15/262,457, mailed Sep. 28, 2018, 16 pages.
Corrected Notice of Allowance for U.S. Appl. No. 15/676,693, mailed Aug. 29, 2018, 5 pages.
Final Office Action for U.S. Appl. No. 15/601,858, mailed Nov. 26, 2018, 16 pages.
Non-Final Office Action for U.S. Appl. No. 15/945,418, mailed Nov. 1, 2018, 13 pages.
First Office Action for Chinese Patent Application No. 201510746323.X, mailed Nov. 2, 2018, 12 pages.
Advisory Action for U.S. Appl. No. 15/601,858, mailed Jan. 22, 2019, 3 pages.
Notice of Allowance for U.S. Appl. No. 16/038,879, mailed Jan. 9, 2019, 8 pages.
Notice of Allowance for U.S. Appl. No. 16/004,961, mailed Jan. 11, 2019, 8 pages.
International Preliminary Report on Patentability for PCT/US2017/046744, mailed Feb. 21, 2019, 11 pages.
International Preliminary Report on Patentability for PCT/US2017/046758, mailed Feb. 21, 2019, 11 pages.
International Preliminary Report on Patentability for PCT/US2017/046779, mailed Feb. 21, 2019, 11 pages.
Non-Final Office Action for U.S. Appl. No. 15/992,613, mailed Feb. 27, 2019, 15 pages.
Non-Final Office Action for U.S. Appl. No. 15/695,579, mailed Jan. 28, 2019, 8 pages.
Notice of Allowance for U.S. Appl. No. 15/992,639, mailed May 9, 2019, 7 pages.
Notice of Allowance for U.S. Appl. No. 15/695,579, mailed Mar. 20, 2019, 8 pages.
Notice of Allowance for U.S. Appl. No. 16/004,961, mailed May 13, 2019, 8 pages.
Non-Final Office Action for U.S. Appl. No. 15/601,858, mailed Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, mailed May 24, 2019, 11 pages.
Non-Final Office Action for U.S. Appl. No. 15/873,152, mailed May 24, 2019, 11 pages.
Notice of Allowance for U.S. Appl. No. 16/168,327, mailed Jun. 28, 2019, 7 pages.

Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, mailed Jun. 21, 2019, 7 pages.
Notice of Reasons for Refusal for Japanese Patent Application No. 2015-180657, mailed Jul. 9, 2019, 4 pages.
Notice of Allowance for U.S. Appl. No. 15/601,858, mailed Aug. 16, 2019, 8 pages.
Advisory Action for U.S. Appl. No. 15/992,613, mailed Jul. 29, 2019, 3 pages.
Final Office Action for U.S. Appl. No. 15/873,152, mailed Aug. 8, 2019, 13 pages.
Notice of Allowance for U.S. Appl. No. 15/975,230, mailed Jul. 22, 2019, 7 pages.
Notice of Allowance for U.S. Appl. No. 16/004,961, mailed Aug. 28, 2019, 8 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Corrected Notice of Allowability for U.S. Appl. No. 15/695,579, mailed Feb. 5, 2020, 5 pages.
Notice of Allowance for U.S. Appl. No. 15/992,613, mailed Sep. 23, 2019, 7 pages.
Non-Final Office Action for U.S. Appl. No. 16/204,214, mailed Oct. 9, 2019, 15 pages.
Non-Final Office Action for U.S. Appl. No. 15/816,637, mailed Oct. 31, 2019, 10 pages.
Advisory Action for U.S. Appl. No. 15/873,152, mailed Oct. 11, 2019, 3 pages.
Notice of Allowance for U.S. Appl. No. 15/873,152, mailed Dec. 10, 2019, 9 pages.
Notice of Allowance for U.S. Appl. No. 16/454,809, mailed Nov. 25, 2020, 8 pages.
Non-Final Office Action for U.S. Appl. No. 16/427,019, mailed Nov. 19, 2020, 19 pages.
Non-Final Office Action for U.S. Appl. No. 16/678,573, mailed Feb. 19, 2021, 11 pages.
Non-Final Office Action for U.S. Appl. No. 16/678,602, mailed Feb. 19, 2021, 10 pages.
First Office Action for Chinese Patent Application No. 201680058198.6, mailed Dec. 29, 2020, 14 pages.
International Preliminary Report on Patentability for International Patent Application No. PCT/US2019/025591, mailed Oct. 15, 2020, 6 pages.
International Preliminary Report on Patentability for International Patent Application No. PCT/US2019/034645, mailed Jan. 14, 2021, 9 pages.
Corrected Notice of Allowability for U.S. Appl. No. 16/426,527, mailed Aug. 18, 2021, 4 pages.

(56) References Cited

OTHER PUBLICATIONS

Advisory Action and Examiner-Initiated Interview Summary for U.S. Appl. No. 16/678,551, mailed Sep. 13, 2021, 3 pages.
Notice of Allowance and Examiner-Initiated Interview Summary for U.S. Appl. No. 16/678,551, mailed Oct. 21, 2021, 8 pages.
Advisory Action and Examiner-Initiated Interview Summary for U.S. Appl. No. 16/678,573, mailed Sep. 10, 2021, 3 pages.
Notice of Allowance and Examiner-Initiated Interview Summary for U.S. Appl. No. 16/678,573, mailed Oct. 21, 2021, 7 pages.
Non-Final Office Action for U.S. Appl. No. 16/678,586, mailed Aug. 12, 2021, 16 pages.
Notice of Allowance and Examiner-Initiated Interview Summary for U.S. Appl. No. 16/678,602, mailed Aug. 12, 2021, 11 pages.
Corrected Notice of Allowability for U.S. Appl. No. 16/678,602, mailed Aug. 26, 2021, 4 pages.
Decision to Grant for Japanese Patent Application No. 2020119130, mailed Sep. 7, 2021, 4 pages.
Second Office Action for Chinese Patent Application No. 201680058198.6, mailed Sep. 8, 2021, 8 pages.
Quayle Action for U.S. Appl. No. 16/426,527, mailed May 26, 2022, 5 pages.
Final Office Action for U.S. Appl. No. 16/427,019, mailed Apr. 12, 2022, 15 pages.
Advisory Action for U.S. Appl. No. 16/427,019, mailed Jun. 2, 2022, 3 pages.
Corrected Notice of Allowability for U.S. Appl. No. 16/678,551, mailed May 13, 2022, 3 pages.
Corrected Notice of Allowability for U.S. Appl. No. 16/678,551, mailed Jun. 15, 2022, 3 pages.
Corrected Notice of Allowability for U.S. Appl. No. 16/678,573, mailed May 6, 2022, 3 pages.
Corrected Notice of Allowability for U.S. Appl. No. 16/678,573, mailed Jun. 10, 2022, 3 pages.
Corrected Notice of Allowability for U.S. Appl. No. 16/678,602, mailed Apr. 8, 2022, 4 pages.
Corrected Notice of Allowability for U.S. Appl. No. 16/678,602, mailed May 13, 2022, 4 pages.
Corrected Notice of Allowability for U.S. Appl. No. 16/678,602, mailed Jun. 10, 2022, 4 pages.
Notice of Allowance for U.S. Appl. No. 17/109,935, mailed Apr. 20, 2022, 15 pages.
International Search Report and Written Opinion for International Patent Application No. PCT/US2021/063093, mailed May 4, 2022, 15 pages.
Invitation to Pay Additional Fees and Partial International Search for International Patent Application No. PCT/US2021/063094, mailed Apr. 19, 2022, 15 pages.
International Search Report and Written Opinion for International Patent Application No. PCT/US2021/062509, mailed Mar. 29, 2022, 20 pages.
Non-Final Office Action for U.S. Appl. No. 16/426,527, mailed Feb. 16, 2022, 9 pages.
Corrected Notice of Allowability for U.S. Appl. No. 16/678,551, mailed Mar. 9, 2022, 3 pages.
Corrected Notice of Allowability for U.S. Appl. No. 16/678,573, mailed Mar. 31, 2022, 3 pages.
Non-Final Office Action for U.S. Appl. No. 16/678,586, mailed Mar. 3, 2022, 14 pages.
Corrected Notice of Allowability for U.S. Appl. No. 16/678,602, mailed Feb. 2, 2022, 4 pages.
Corrected Notice of Allowability for U.S. Appl. No. 16/678,602, mailed Mar. 9, 2022, 4 pages.
Non-Final Office Action for U.S. Appl. No. 16/844,406, mailed Mar. 14, 2022, 16 pages.
Summons to Attend for European Patent Application No. 16751791.1, mailed Feb. 28, 2022, 10 pages.
Decision to Grant for Japanese Patent Application No. 2019507765, mailed Feb. 10, 2022, 6 pages.
Decision to Grant for Japanese Patent Application No. 2019507768, mailed Feb. 10, 2022, 6 pages.

Office Letter for Taiwanese Patent Application No. 108140788, mailed Jan. 5, 2022, 16 pages.
Corrected Notice of Allowability for U.S. Appl. No. 16/678,551, mailed Apr. 11, 2022, 3 pages.
Final Office Action for U.S. Appl. No. 16/844,406, mailed Jun. 24, 2022, 17 pages.
Non-Final Office Action for U.S. Appl. No. 17/330,787, mailed Oct. 17, 2022, 10 pages.
Notice of Allowance and Examiner-Initiated Interview Summary for U.S. Appl. No. 16/678,586, mailed Sep. 13, 2022, 11 pages.
Corrected Notice of Allowability for U.S. Appl. No. 16/678,602, mailed Oct. 5, 2022, 4 pages.
Non-Final Office Action for U.S. Appl. No. 16/844,406, mailed Oct. 6, 2022, 17 pages.
Corrected Notice of Allowability U.S. Appl. No. 17/109,935, mailed Sep. 14, 2022, 4 pages.
Notice of Preliminary Rejection for Korean Patent Application No. 10-2018-7006660, mailed Sep. 3, 2022, 6 pages.
Corrected Notice of Allowability for U.S. Appl. No. 17/109,935, mailed Jan. 10, 2023, 4 pages.
First Office Action for Chinese Patent Application No. 201780063121.2, mailed Nov. 23, 2022, 12 pages.
Preliminary Examination Report for Taiwanese Patent Application No. 108140788, mailed Dec. 9, 2022, 13 pages.
Non-Final Office Action for U.S. Appl. No. 16/426,527, mailed Feb. 9, 2023, 9 pages.
Notice of Allowance for U.S. Appl. No. 16/390,496, mailed Oct. 27, 2022, 21 pages.
Notice of Allowance for U.S. Appl. No. 16/204,214, mailed Oct. 28, 2022, 11 pages.
Final Office Action for U.S. Appl. No. 16/427,019, mailed Dec. 12, 2022, 19 pages.
Corrected Notice of Allowability for U.S. Appl. No. 16/678,551, mailed Oct. 4, 2022, 3 pages.
Corrected Notice of Allowability for U.S. Appl. No. 16/678,551, mailed Nov. 2, 2022, 3 pages.
Corrected Notice of Allowability for U.S. Appl. No. 16/678,551, mailed Dec. 7, 2022, 3 pages.
Non-Final Office Action for U.S. Appl. No. 17/573,112, mailed Dec. 9, 2022, 6 pages.
Corrected Notice of Allowability for U.S. Appl. No. 16/678,602, mailed Nov. 14, 2022, 4 pages.
Corrected Notice of Allowability for U.S. Appl. No. 16/678,602, mailed Dec. 9, 2022, 4 pages.
Non-Final Office Action for U.S. Appl. No. 17/554,477, mailed Nov. 25, 2022, 6 pages.
Notice of Allowance for U.S. Appl. No. 17/109,935, mailed Oct. 28, 2022, 7 pages.
Corrected Notice of Allowability for U.S. Appl. No. 17/109,935, mailed Nov. 10, 2022, 4 pages.
First Office Action for Chinese Patent Application No. 201780062516.0, mailed Nov. 2, 2022, 10 pages.
Notice of Reasons for Rejection for Japanese Patent Application No. 2022032477, mailed Oct. 3, 2022, 4 pages.
First Office Action for Chinese Patent Application No. 201780058052.6, mailed Nov. 2, 2022, 22 pages.
Notice of Allowance for U.S. Appl. No. 17/330,787, mailed Dec. 15, 2022, 7 pages.
Notice of Allowance for U.S. Appl. No. 16/426,527, mailed Aug. 17, 2022, 7 pages.
Non-Final Office Action for U.S. Appl. No. 16/427,019, mailed Aug. 15, 2022, 17 pages.
Corrected Notice of Allowability for U.S. Appl. No. 16/678,551, mailed Jul. 14, 2022, 3 pages.
Final Office Action for U.S. Appl. No. 16/678,586, mailed Sep. 1, 2022, 7 pages.
Corrected Notice of Allowability for U.S. Appl. No. 16/678,602, mailed Jul. 14, 2022, 4 pages.
Advisory Action for U.S. Appl. No. 16/844,406, mailed Jul. 26, 2022, 3 pages.
Corrected Notice of Allowability U.S. Appl. No. 17/109,935, mailed Jul. 1, 2022, 4 pages.

(56) References Cited

OTHER PUBLICATIONS

Corrected Notice of Allowability U.S. Appl. No. 17/109,935, mailed Jul. 27, 2022, 4 pages.
International Search Report and Written Opinion for International Patent Application No. PCT/US2021/063094, mailed Aug. 9, 2022, 24 pages.
Corrected Notice of Allowability for U.S. Appl. No. 16/678,551, mailed Sep. 2, 2022, 3 pages.
Corrected Notice of Allowability for U.S. Appl. No. 16/678,602, mailed Sep. 2, 2022, 4 pages.
First Office Action for Chinese Patent Application No. 201980079375.2, mailed May 5, 2023, 17 pages.
Preliminary Examination Report for Taiwanese Patent Application No. 109102895, mailed May 30, 2023, 18 pages.
Preliminary Examination Report for Taiwanese Patent Application No. 109102896, mailed Jul. 4, 2023, 19 pages.
Final Office Action for U.S. Appl. No. 16/426,527, mailed May 25, 2023, 9 pages.
Notice of Allowance for U.S. Appl. No. 16/426,527, mailed Jun. 22, 2023, 8 pages.
Final Office Action for U.S. Appl. No. 16/678,551, mailed May 26, 2023, 16 pages.
Non-Final Office Action for U.S. Appl. No. 16/844,406, mailed Jun. 23, 2023, 18 pages.
Preliminary Examination Report for Taiwanese Patent Application No. 109102894, mailed Apr. 7, 2023, 20 pages.
Notice of Allowance for U.S. Appl. No. 17/306,194, mailed Aug. 24, 2023, 10 pages.
Notice of Allowance for U.S. Appl. No. 16/390,496, mailed Aug. 24, 2023, 24 pages.
Notice of Allowance for U.S. Appl. No. 17/970,078, mailed Aug. 25, 2023, 10 pages.
Advisory Action for U.S. Appl. No. 16/678,551, mailed Jul. 28, 2023, 3 pages.
Applicant-Initiated Interview Summary for U.S. Appl. No. 16/678,551, mailed Aug. 22, 2023, 7 pages.
Applicant-Initiated Interview Summary for U.S. Appl. No. 16/844,406, mailed Sep. 13, 2023, 2 pages.
Final Office Action for U.S. Appl. No. 16/844,406, mailed Sep. 28, 2023, 7 pages.
Final Office Action for U.S. Appl. No. 17/121,194, mailed Sep. 7, 2023, 24 pages.
Notice of Allowance for U.S. Appl. No. 17/389,977, mailed Aug. 16, 2023, 8 pages.
Corrected Notice of Allowability for U.S. Appl. No. 17/389,977, mailed Sep. 20, 2023, 5 pages.
Office Action for Taiwanese Patent Application No. 108119536, mailed Jul. 13, 2023, 6 pages.
First Office Action for Chinese Patent Application No. 201980077328.4, mailed Aug. 28, 2023, 15 pages.
Notice of Preliminary Rejection for Korean Patent Application No. 1020217026777, mailed Jul. 28, 2023, 12 pages.
Notice of Allowance for U.S. Appl. No. 16/427,019, mailed Mar. 10, 2023, 10 pages.
Non-Final Office Action for U.S. Appl. No. 16/678,551, mailed Mar. 28, 2023, 14 pages.
Notice of Allowance for U.S. Appl. No. 17/573,112, mailed Mar. 8, 2023, 8 pages.
Notice of Allowance for U.S. Appl. No. 17/554,477, mailed Mar. 7, 2023, 8 pages.
Final Office Action for U.S. Appl. No. 16/844,406, mailed Mar. 6, 2023, 13 pages.
Corrected Notice of Allowability for U.S. Appl. No. 17/109,935, mailed Mar. 1, 2023, 4 pages.
Corrected Notice of Allowability for U.S. Appl. No. 17/109,935, mailed Apr. 12, 2023, 4 pages.
Non-Final Office Action for U.S. Appl. No. 17/121,194, mailed May 9, 2023, 22 pages.
Non-Final Office Action for U.S. Appl. No. 17/389,977, mailed Mar. 28, 2023, 10 pages.

Written Decision on Registration for Korean Patent Application No. 10-2018-7006660, mailed Feb. 24, 2023, 8 pages.
Decision to Grant for Japanese Patent Application No. 2022032477, mailed Mar. 14, 2023, 5 pages.
Decision of Rejection for Chinese Patent Application No. 201780058052.6, mailed Mar. 30, 2023, 16 pages.
Office Action for Taiwanese Patent Application No. 109102892, mailed Apr. 14, 2023, 18 pages.
Advisory Action for U.S. Appl. No. 16/844,406, mailed May 12, 2023, 3 pages.
Notice of Allowance for U.S. Appl. No. 16/678,551, mailed Dec. 7, 2023, 9 pages.
Corrected Notice of Allowability for U.S. Appl. No. 17/389,977, mailed Nov. 24, 2023, 5 pages.
Office Action for Taiwanese Patent Application No. 108119536, mailed Nov. 24, 2023, 22 pages.
Preliminary Examination Report for Taiwanese Patent Application No. 108143149, mailed Oct. 18, 2023, 30 pages.
Second Office Action for Chinese Patent Application No. 201980079375.2, mailed Nov. 21, 2023, 17 pages.
Office Action for Taiwanese Patent Application No. 109102895, mailed Nov. 30, 2023, 16 pages.
Supplemental Notice of Allowability for U.S. Appl. No. 17/306,194, mailed Apr. 2, 2024, 7 pages.
Notice of Allowance for U.S. Appl. No. 18/306,599, mailed Apr. 10, 2024, 8 pages.
Notice of Allowance and Applicant-Initiated Interview Summary for U.S. Appl. No. 16/678,602, mailed Mar. 7, 2024, 14 pages.
Notice of Allowance for Taiwanese Patent Application No. 108119536, mailed Apr. 30, 2024, 4 pages.
Second Office Action for Chinese Patent Application No. 201980077328.4, mailed Mar. 29, 2024, 14 pages.
Office Action for Taiwanese Patent Application No. 113110397, mailed May 7, 2024, 10 pages.
Notice of Preliminary Rejection for Korean Patent Application No. 1020217026747, mailed May 1, 2024, 5 pages.
Quayle Action for U.S. Appl. No. 16/678,551, mailed Oct. 4, 2023, 6 pages.
Non-Final Office Action for U.S. Appl. No. 16/678,602, mailed Oct. 6, 2023, 18 pages.
Notice of Allowance for for U.S. Appl. No. 16/844,406, mailed, Nov. 16, 2023, 11 pages.
Notice of Allowance for U.S. Appl. No. 17/121,194, mailed Oct. 23, 2023, 8 pages.
Corrected Notice of Allowability for U.S. Appl. No. 17/389,977, mailed Oct. 25, 2023, 5 pages.
Board Opinion for Chinese Patent Application No. 201780058052.6, mailed Oct. 8, 2023, 15 pages.
First Office Action for Chinese Patent Application No. 201980050433.9, mailed Sep. 4, 2023, 20 pages.
First Office Action for Chinese Patent Application No. 201980090320.1, mailed Sep. 5, 2023, 11 pages.
Office Action for Taiwanese Patent Application No. 109102892, mailed Sep. 13, 2023, 18 pages.
Preliminary Examination Report for Taiwanese Patent Application No. 109102893, mailed Sep. 7, 2023, 10 pages.
Notice of Allowance for U.S. Appl. No. 16/426,527, mailed Jan. 22, 2024, 10 pages.
Non-Final Office Action for U.S. Appl. No. 18/306,599, mailed Jan. 22, 2024, 11 pages.
Notice of Allowance for U.S. Appl. No. 17/389,977, mailed Jan. 18, 2024, 17 pages.
Board Opinion for Chinese Patent Application No. 201780058052.6, mailed Jan. 15, 2024, 28 pages.
Reasons for Rejection for Taiwanese Patent Application No. 109102896, mailed Dec. 13, 2023, 17 pages.
Notice of Allowance for U.S. Appl. No. 18/151,235, mailed May 29, 2024, 22 pages.
Notice of Preliminary Rejection for Korean Patent Application No. 1020217026777, mailed Apr. 23, 2024, 15 pages.
Notice of Preliminary Rejection for Korean Patent Application No. 1020217026784, mailed May 28, 2024, 13 pages.

(56) References Cited

OTHER PUBLICATIONS

Notice of Preliminary Rejection for Korean Patent Application No. 1020217026776, mailed May 20, 2024, 4 pages.
Notice of Preliminary Rejection for Korean Patent Application No. 1020217026748, mailed May 22, 2024, 15 pages.
Notice of Preliminary Rejection for Korean Patent Application No. 1020217026781, mailed May 29, 2024, 13 pages.
Preliminary Examination Report for Taiwanese Patent Application No. 108143149, mailed May 15, 2024, 20 pages.
Notice of Allowance for U.S. Appl. No. 16/426,527, mailed Aug. 7, 2024, 9 pages.
Examination Report for Taiwanese Patent Application No. 109102896, mailed Jun. 27, 2024, 18 pages.

* cited by examiner

MICROELECTRONICS PACKAGE WITH VERTICALLY STACKED MEMS DEVICE AND CONTROLLER DEVICE

RELATED APPLICATIONS

This application claims the benefit of provisional patent application Ser. No. 62/952,988, filed Dec. 23, 2019, the disclosure of which is hereby incorporated herein by reference in its entirety.

FIELD OF THE DISCLOSURE

The present disclosure relates to a microelectronics package and a process for making the same, and more particularly to a microelectronics package with a vertically stacked structure of a microelectromechanical systems (MEMS) device and its controller device.

BACKGROUND

The wide utilization of cellular and wireless devices drives the rapid development of radio frequency (RF) technologies. The substrates on which RF devices are fabricated play an important role in achieving high level performance in the RF technologies. Fabrications of the RF devices on conventional silicon substrates may benefit from low cost of silicon materials, a large scale capacity of wafer production, well-established semiconductor design tools, and well-established semiconductor manufacturing techniques.

Despite the benefits of using conventional silicon substrates for the RF device fabrications, it is well known in the industry that the conventional silicon substrates may have two undesirable properties for the RF devices: harmonic distortion and low resistivity values. The harmonic distortion is a critical impediment to achieve high level linearity in the RF devices built over silicon substrates. In addition, the low resistivity encountered in the silicon substrates may degrade quality factors (Q) at high frequencies of microelectromechanical systems (MEMS) or other passive components.

Stacked-device assembly technology currently attracts substantial attention in portable RF applications, due to the popularity of portable consumer electronic products, such as smart phones, tablet computers, and so forth. Stacked-device assemblies are designed to achieve electronics densification in a small footprint. However, the thickness of each stacked-device, especially the thickness of the silicon substrate for each stacked-device, may result in a large thickness of the final product, which may not meet low-profile requirements for modern portable applications.

Accordingly, to reduce deleterious harmonic distortion of the RF devices, and to accommodate the low-profile requirements for portable products, it is therefore an object of the present disclosure to provide an improved package design with enhanced performance and a reduced package size without expensive and complicated processes.

SUMMARY

The present disclosure relates to a microelectronics package with a vertically stacked structure of a microelectromechanical systems (MEMS) device and its controller device. The disclosed microelectronics package includes a MEMS device and a controller device vertically stacked underneath the MEMS device. The MEMS device includes a MEMS device region at a top of the MEMS device, a stop layer underneath the MEMS device region, and a MEMS through-via that extends through the stop layer and into the MEMS device region. Herein, the MEMS device region includes a MEMS component and a MEMS connecting layer configured to electrically connect the MEMS component with the MEMS through-via. In addition, the controller device includes a controller bonding layer at a top of the controller device and configured to bond to the MEMS device, a controller device region underneath the controller bonding layer, and a controller through-via that extends through the controller bonding layer and into the controller device region. Herein, the controller device region includes a controlling component and a controller connecting layer configured to electrically connect the controlling component with the controller through-via. The controller through-via is in contact with the MEMS through-via, such that the controlling component in the controller device region is configured to control the MEMS component in the MEMS device region through the controller connecting layer, the controller through-via, the MEMS through-via, and the MEMS connecting layer.

In one embodiment of the microelectronics package, silicon crystal, which has no germanium, nitrogen, or oxygen content, does not exist between the MEMS device region and the controller device region.

In one embodiment of the microelectronics package, the MEMS through-via does not extend toward or into portions of the MEMS device region where the MEMS component is located, and the controller through-via does not extend toward or into portions of the controller device region where the controlling component is located.

In one embodiment of the microelectronics package, the stop layer in the MEMS device is formed of silicon oxide, and the controller bonding layer is formed of silicon oxide.

In one embodiment of the microelectronics package, the stop layer is at a bottom of the MEMS device and directly bonded with the controller bonding layer of the controller device.

In one embodiment of the microelectronics package, the MEMS device further includes a MEMS enhancement region underneath the stop layer and a MEMS bonding layer underneath the MEMS enhancement region. Herein, the MEMS through-via extends through the MEMS bonding layer, the MEMS enhancement region, the stop layer and into the MEMS device region. The MEMS enhancement region includes at least one of a MEMS barrier layer and a MEMS thermally conductive layer. The MEMS bonding layer underneath the MEMS enhancement region is at a bottom of the MEMS device and directly bonded with the controller bonding layer of the controller device. The MEMS bonding layer is formed of silicon oxide.

In one embodiment of the microelectronics package, between the stop layer and the MEMS enhancement region, there is a MEMS handle substrate with a thickness between 0 μm to 50 μm.

In one embodiment of the microelectronics package, the MEMS enhancement region includes the MEMS barrier layer underneath the stop layer and the MEMS thermally conductive layer underneath the MEMS barrier layer. The MEMS barrier layer is formed of silicon nitride with a thickness between 0.2 μm and 10 μm, and the MEMS thermally conductive layer is formed of aluminum nitride with a thickness between 0.1 μm and 20 μm.

In one embodiment of the microelectronics package, the MEMS device region further includes a MEMS cavity, MEMS dielectric layers, and a number of MEMS connecting layers that includes the MEMS connecting layer. The MEMS cavity is formed within the MEMS dielectric layers, and the MEMS component is located in the MEMS cavity, such that the MEMS component can be free to actuate. The MEMS connecting layers are partially covered by the MEMS dielectric layers and are configured to electrically connect the MEMES component to components outside the MEMS device region.

According to another embodiment, the microelectronics package further includes a number of bump structures, which are on formed over the MEMS device region, and electrically coupled to the MEMS component through the plurality of MEMS connecting layers.

In one embodiment of the microelectronics package, the controller device region includes a back-end-of-line (BEOL) portion underneath the controller bonding layer, and a front-end-of-line (FEOL) portion underneath the BEOL portion. The FEOL portion includes a contact layer underneath the BEOL portion, an active layer underneath the contact layer, and isolation sections underneath the contact layer and surrounding the active layer. Herein, a combination of the active layer and the contact layer provides the controlling component. The BEOL portion includes controller dielectric layers, and a number of controller connecting layers that includes the controller connecting layer. The controller connecting layers are partially covered by the controller dielectric layers and are configured to electrically connect the controlling component in the FEOL portion to components outside the controller device region.

In one embodiment of the microelectronics package, the isolation sections extend vertically beyond a bottom surface of the active layer to define an opening within the isolation sections and underneath the active layer.

In one embodiment of the microelectronics package, the controller device further includes a controller enhancement region underneath the FEOL portion of the controller device region. The controller enhancement region includes at least one of a controller barrier layer and a controller thermally conductive layer. In addition, the controller enhancement region continuously covers bottom surfaces of the isolation sections and exposed surfaces within the opening so as to cover the active layer.

In one embodiment of the microelectronics package, the controller device further includes a passivation layer underneath the FEOL portion of the controller device region. The passivation layer continuously covers bottom surfaces of the isolation sections and exposed surfaces within the opening so as to cover the active layer. The passivation layer is formed of silicon dioxide.

According to another embodiment, the microelectronics package further includes a mold compound formed underneath the passivation layer. The mold compound has a thermal conductivity greater than 1 W/m·K and a dielectric constant less than 8.

In one embodiment of the microelectronics package, the controller device further includes a controller enhancement region underneath the passivation layer. The controller enhancement region includes at least one of a controller barrier layer and a controller thermally conductive layer.

According to another embodiment, the microelectronics package further includes a mold compound formed underneath the controller enhancement region. The mold compound has a thermal conductivity greater than 1 W/m·K and a dielectric constant less than 8.

In one embodiment of the microelectronics package, a bottom surface of each isolation section and the bottom surface of the active layer are coplanar, such that the FEOL portion of the controller device region has a flat bottom surface.

In one embodiment of the microelectronics package, the controller device further includes an oxide layer underneath the FEOL portion of the controller device region. Herein, the oxide layer continuously covers bottom surfaces of the isolation sections and the active layer. The oxide layer is formed of silicon dioxide.

In one embodiment of the microelectronics package, the FEOL portion further includes a body for the controlling component, which fills the opening and extends underneath the bottom surfaces of the isolation sections.

In one embodiment of the microelectronics package, the controller device further includes a controller enhancement region underneath the body. Herein, the controller enhancement region includes at least one of a controller barrier layer and a controller thermally conductive layer.

In one embodiment of the microelectronics package, the controlling component is a switch field-effect transistor (FET).

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
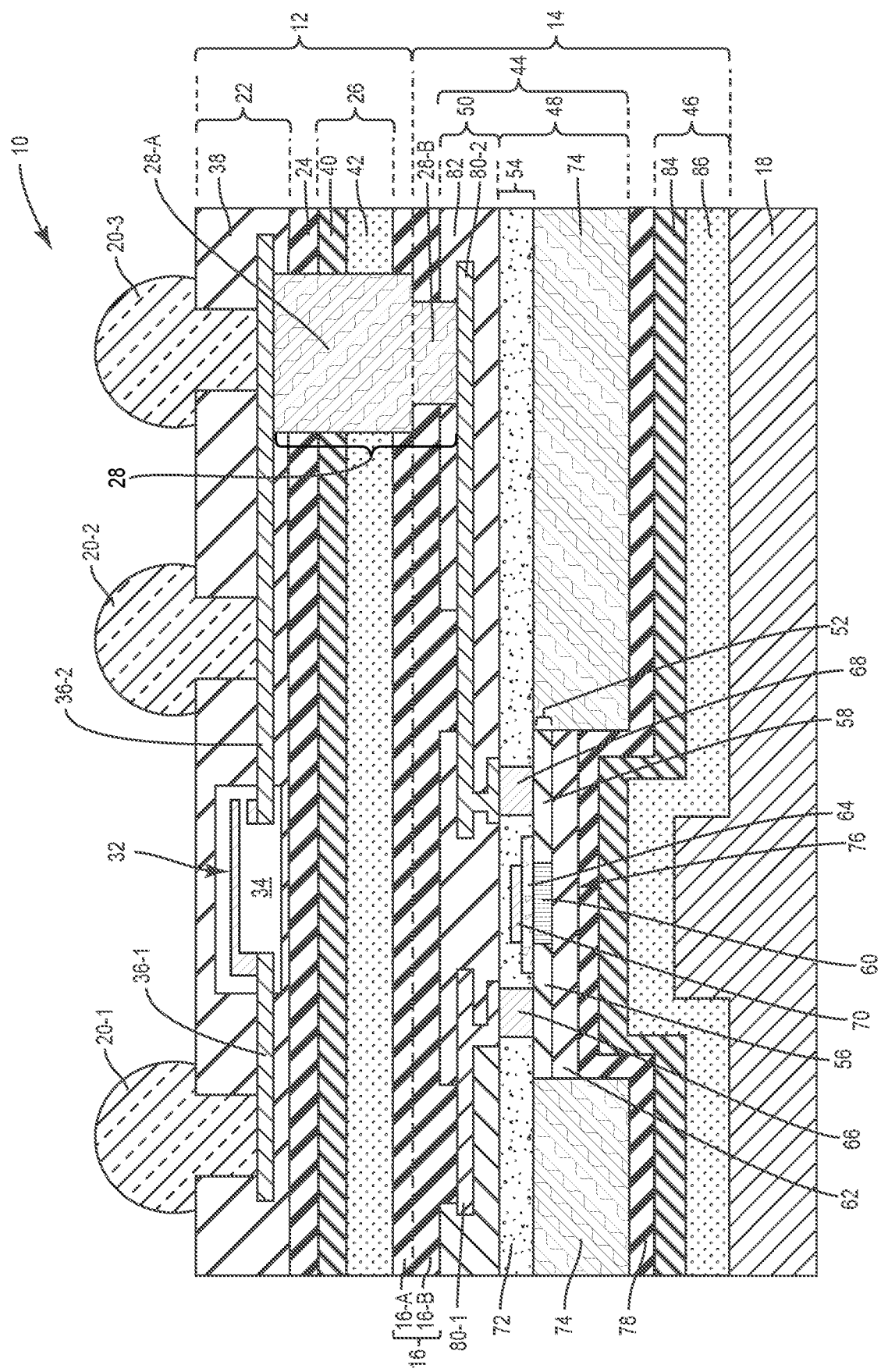
FIG. 1 illustrates an exemplary microelectronics package with vertically stacked devices according to one embodiment of the present disclosure.

FIGS. 4A-14 provide exemplary steps that illustrate a process to fabricate the exemplary microelectronics package illustrated in FIG. 1.

It will be understood that for clear illustrations, FIGS. 1-14 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates an exemplary microelectronics package 10 with vertically stacked devices according to one embodiment of the present disclosure. For the purpose of this illustration, the microelectronics package 10 includes a microelectromechanical systems (MEMS) device 12, a controller device 14 vertically stacked with the MEMS device 12. Herein, the MEMS device 12 and the controller device 14 are bonded at a bonding region 16, which includes a MEMS bonding layer 16-A from the MEMS device 12 and a controller bonding layer 16-B from the controller device 14. In addition, the microelectronics package 10 may also include a mold compound 18 underneath the controller device 14, and multiple bump structures 20 over the MEMS device 12. In different applications, the microelectronics package 10 may include different stacked devices other than the MEMS device 12 and its controller device 14.

In the MEMS device 12, a MEMS device region 22 is at a top of the MEMS device 12, a stop layer 24 is underneath the MEMS device region 22, a MEMS enhancement region 26 is underneath the stop layer 24, the MEMS bonding layer 16-A is underneath the MEMS enhancement region 26, and a MEMS through-via 28-A that extends through the MEMS bonding layer 16-A, the MEMS enhancement region 26, and the stop layer 24, and extends into the MEMS device region 22.

In detail, the MEMS device region 22 includes a MEMS component 32, a MEMS cavity 34, MEMS connecting layers 36, and MEMS dielectric layers 38. Herein, the MEMS cavity 34 is formed within the MEMS dielectric layers 38, and the MEMS component 32, typically a switch, is located in the MEMS cavity 34, such that the MEMS component 32 can be free to actuate. The MEMS connecting layers 36 are partially covered by the MEMS dielectric layers 38, and are configured to electrically connect the MEMS component 32 in the MEMS cavity 34 to the bump structures 20. For the purpose of this illustration, a first bump structure 20-1 is connected to the MEMS component 32 through a first MEMS connecting layer 36-1, while a second bump structure 20-2 and a third bump structure 20-3 are connected to the MEMS component 32 through a second MEMS connecting layer 36-2. In different applications, there might be more MEMS connecting layers 36 and more/fewer bump structures 20 connected to the MEMS connecting layers in a different configuration.

The stop layer 24 is formed underneath the MEMS device region 22 and extends over an entire bottom surface of the MEMS device region 22. The stop layer 24 may be formed of silicon oxide with a thickness between 10 nm and 5000 nm. In some applications, there might be a thin MEMS handle substrate, with a thickness between 0 µm and 50 µm or between 0.1 µm and 20 µm, underneath the stop layer 24 (not shown).

The MEMS enhancement region 26 is formed underneath the stop layer 24, and extends over an entire bottom surface of the stop layer 24. If the thin MEMS handle substrate exists, the MEMS enhancement region 26 may be directly formed underneath the thin MEMS handle substrate. If the thin MEMS handle substrate does not exist (in a desired case), the MEMS enhancement region 26 may be directly formed underneath the stop layer 24.

The MEMS enhancement region 26 is configured to enhance reliability and/or thermal performance of the MEMS component 32. In one embodiment, the MEMS enhancement region 26 includes a MEMS barrier layer 40 formed underneath the stop layer 24, and a MEMS thermally conductive layer 42 formed underneath the MEMS barrier layer 40. Herein, the MEMS barrier layer 40 is formed of silicon nitride with a thickness between 2000 Å and 10 µm. The MEMS barrier layer 40 is configured to provide a superior barrier to moisture and impurities, which could diffuse into the MEMS cavity 34 and cause reliability concerns to the MEMS component 32. Moisture, for example, may diffuse readily through a silicon oxide layer (like the stop layer 24), but even a thin nitride layer (like the MEMS barrier layer 40) reduces the diffusion of the water molecule by several orders of magnitude, acting as an ideal barrier. In addition, the MEMS barrier layer 40 may also be engineered so as to provide additional tensile strain to the MEMS device region 22. Such strain may be beneficial in providing minimal warpage of the stacked layers. Furthermore, the MEMS barrier layer 40 may also provide thermal benefit to the MEMS device region 22.

The MEMS thermally conductive layer 42, which may be formed of aluminum nitride with a thickness between 0.1 μm and 20 μm, could provide superior thermal dissipation for the MEMS device region 22, in the order of 275 W/mk while retaining superior electrically insulating characteristics. The MEMS thermally conductive layer 42 might be very important to the overall thermal behavior of the stacked layers. If power dissipation is not a concern, then the MEMS thermally conductive layer 42 may be omitted. Due to different application needs, the entire MEMS enhancement region 26 might be omitted, or the MEMS barrier layer 40 might be omitted while the MEMS thermally conductive layer 42 might be retained.

The MEMS device 12 also includes the MEMS bonding layer 16-A for bonding to the controller device 14. The MEMS bonding layer 16A may be formed of silicon oxide. If the MEMS device 12 includes the MEMS enhancement region 26 with the MEMS barrier layer 40 and the MEMS thermally conductive layer 42, the MEMS bonding layer 16-A is formed directly underneath the MEMS thermally conductive layer 42. If the MEMS barrier layer 40 is retained while the MEMS thermally conductive layer 42 is omitted, the MEMS bonding layer 16-A is formed directly underneath the MEMS barrier layer 40. If the MEMS barrier layer 40 is omitted while the MEMS thermally conductive layer 42 is retained, the MEMS bonding layer 16-A is formed directly underneath MEMS thermally conductive layer 42. If the entire MEMS enhancement region 26 is omitted in the MEMS device 12, there might not be a need for the MEMS bonding layer 16-A, since the stop layer 24 may also be used for bonding to the controller device 14.

The MEMS through-via 28-A extends through the MEMS bonding layer 16-A, the MEMS enhancement region 26, and the stop layer 24, and extends into the MEMS device region 22. The MEMS through-via 28-A does not extend toward or into the portions of the MEMS device region 22 where the MEMS cavity 34 and the MEMS component 32 are located. The MEMS through-via 28-A (with the controller through-via 28-B, described in following paragraphs) is configured to electrically connect the MEMS device 12 and the controller device 14. For the purpose of this illustration, the MEMS through-via 28-A is connected to the MEMS component 32 through the second MEMS connecting layer 36-2. The MEMS through-via 28-A may be formed of copper.

The controller device 14 includes the controller bonding layer 16-B at a top of the controller device 14 for bonding to the MEMS bonding layer 16-A, so as to bond to the MEMS device 12. The MEMS bonding layer 16-A and the controller bonding layer 16-B are formed of a same material, such as silicon oxide, and are combined directly together as the bonding region 16. If the MEMS device 12 does not include the MEMS enhancement region 26 and the MEMS bonding layer 16-A, the controller bonding layer 16-B at the top of the controller device 14 might be directly bonded to the stop layer 24 of the MEMS device 12.

The controller device 14 also includes a controller device region 44 formed underneath the controller bonding layer 16-B, a controller through-via 28-B that extends through the controller bonding layer 16-B and into the controller device region 44, and a controller enhancement region 46 formed underneath the controller device region 44.

Notice that, between the MEMS device region 22 and the controller device region 44, there are the bonding regions 16 (the MEMS bonding layer 16-A and the controller bonding layer 16-B), optionally the MEMS enhancement region 26 (the MEMS barrier layer 40 and/or the MEMS thermally conductive layer 42), optionally the thin MEMS handle substrate (not shown), the stop layer 24, and the through-vias (the MEMS through-via 28-A and the controller through-via 28-B). In a desired case, there is no MEMS handle substrate, such that, silicon crystal, which has no germanium, nitrogen, or oxygen content, does not exist between the MEMS device region 22 and the controller device region 44. Each of the MEMS barrier layer 40, the MEMS thermally conductive layer 42, and the MEMS bonding layer 16-A is formed of silicon composite.

The controller device region 44 includes a front-end-of-line (FEOL) portion 48 and a back-end-of-line (BEOL) portion 50. The BEOL portion 50 is formed underneath the controller bonding layer 16-B, and the FEOL portion 48 is formed underneath the BEOL portion 50. In one embodiment, the FEOL portion 48 may be configured to provide a switch field-effect transistor (FET) that controls the MEMS component 32 in the MEMS device 12. The FEOL portion 48 includes an active layer 52 and a contact layer 54 over the active layer 52. The active layer 52 may include a source 56, a drain 58, and a channel 60 between the source 56 and the drain 58. In some applications, there might be a body 62 residing underneath the active layer 52. The body 62 may be formed of silicon with a thickness between 10 nm and 500 nm.

The contact layer 54 is formed over the active layer 52 and includes a gate structure 64, a source contact 66, a drain contact 68, and a gate contact 70. The gate structure 64 may be formed of silicon oxide, and extends horizontally over the channel 60 (i.e., from over the source 56 to over the drain 58). The source contact 66 is connected to and over the source 56, the drain contact 68 is connected to and over the drain 58, and the gate contact 70 is connected to and over the gate structure 64. An insulating material 72 may be formed around the source contact 66, the drain contact 68, the gate structure 64, and the gate contact 70 to electrically separate the source 56, the drain 58, and the gate structure 64. In different applications, the FEOL portion 48 may have different FET configurations or provide different device components to control the MEMS component 32.

In addition, the FEOL portion 48 also includes isolation sections 74, which reside underneath the insulating material 72 of the contact layer 54 and surround the active layer 52 (and surround the body 62 if the body 62 exists). The isolation sections 74 are configured to electrically separate the controller device 14, especially the active layer 52, from other devices formed in a common controller wafer (not shown). Herein, the isolation sections 74 may extend from a bottom surface of the contact layer 54 and vertically beyond a bottom surface of the active layer 52 (and beyond the body 62 if the body 62 exists) to define an opening 76 that is within the isolation sections 74 and underneath the active layer 52 (and underneath the body 62 if the body 62 exists). The isolation sections 74 may be formed of silicon dioxide, which may be resistant to etching chemistries such as tetramethylammonium hydroxide (TMAH), xenon difluoride (XeF$_2$), potassium hydroxide (KOH), sodium hydroxide (NaOH), or acetylcholine (ACH), and may be resistant to a dry etching system, such as a reactive ion etching (RIE) system with a chlorine-based gas chemistry or a fluorine-based gas chemistry.

In some applications, the active layer 52 may be passivated to achieve proper low levels of current leakage in the device. The passivation may be accomplished with deposition of a passivation layer 78 underneath the FEOL portion 48 of the controller device region 44. Herein, the passivation layer 78 may extend over an entire bottom surface of the FEOL portion 48, such that the passivation layer 78 continuously covers exposed surfaces within the opening 76 and bottom surfaces of the isolation sections 74. In some applications, the passivation layer 78 may only cover a bottom surface of the active layer 52 (covers a bottom surface of the body 62 if the body 62 exists) and resides within the opening 76 (not shown). The passivation layer 78 may be formed of silicon oxide.

The BEOL portion 50 is over the FEOL portion 48 and includes multiple controller connecting layers 80 formed within controller dielectric layers 82. The controller connecting layers 80 may have one or more top portions not covered by the controller dielectric layers 82, such that the controller through-via 28-B can be electrically connected to one of the uncovered top portions of the controller connecting layers 80. For the purpose of this illustration, a first controller connecting layer 80-1 is connected to the source contact 66 (may be used for other internal connections, not shown), and a second controller connecting layer 80-2 is configured to connect the drain contact 68 to the controller through-via 28-B.

The controller through-via 28-B, which extends through the controller bonding layer 16-B and into the controller device region 44, is in contact with and electrically connected with the MEMS through-via 28-A. The controller through-via 28-B does not extend toward or into the portions of the controller device region 44 where the switch FET (the active layer 52) provided in the FEOL portion 48 is located. The MEMS through-via 28-A and the controller through-via 28-B are combined directly together as the through-via structure 28. As such, the switch FET provided in the FEOL portion 48 of the controller device 14 could control the MEMS component 32 in the MEMS device 12 through the second controller connecting layer 80-2, the through-via structure 28, and the second MEMS connecting layer 36-2. In some applications, the MEMS through-via 28-A and the controller through-via 28-B may have different plane sizes and/or different vertical heights.

The controller enhancement region 46 is formed underneath the passivation layer 78. If there is no passivation layer 78, the controller enhancement region 46 is formed underneath the controller device region 44 and extends over the entire bottom surface of the FEOL portion 48, such that the controller enhancement region 46 continuously covers exposed surfaces within the opening 76 and bottom surfaces of the isolation sections 74 (not shown). If the passivation layer 78 is only formed underneath the active layer 52 and within the opening 76, the controller enhancement region 46 still continuously covers exposed surfaces (including the passivation layer 78) within the opening 76 and bottom surfaces of the isolation sections 74 (not shown). The controller enhancement region 46 is configured to enhance reliability and/or thermal performance of the controller device region 44, especially the active layer 52 in the controller device region 44.

In one embodiment, the controller enhancement region 46 includes a controller barrier layer 84 formed underneath the passivation layer 78, and a controller thermally conductive layer 86 formed underneath the controller barrier layer 84. Herein, the controller barrier layer 84 may be formed of silicon nitride with a thickness between 2000 Å and 10 μm. The controller barrier layer 84 is configured to provide a superior barrier to moisture and impurities, which could diffuse into the channel 60 of the active layer 52 and cause reliability concerns in the device. Moisture, for example, may diffuse readily through a silicon oxide layer (like the passivation layer 78), but even a thin nitride layer (like the controller barrier layer 84) reduces the diffusion of the water molecule by several orders of magnitude, acting as an ideal barrier. In addition, the controller barrier layer 84 may also be engineered so as to provide additional tensile strain to the controller device region 44. Such strain may be beneficial in providing additional improvement of electron mobility in n-channel devices. In some applications, the controller barrier layer 84 formed of silicon nitride may further passivate the active layer 52. In such case, there may be no need for the passivation layer 78.

The controller thermally conductive layer 86, which may be formed of aluminum nitride with a thickness between 0.1 μm and 20 μm, could provide superior thermal dissipation for the controller device region 44, in the order of 275 W/mk while retain superior electrically insulating characteristics. The controller thermally conductive layer 86 might be very important to the overall thermal behavior of the stacked layers. If power dissipation is not a concern, then the controller thermally conductive layer 86 may be omitted. Due to different application needs, the entire controller enhancement region 46 might be omitted, or the controller barrier layer 84 might be omitted while the controller thermally conductive layer 86 might be retained.

The mold compound 18 is formed underneath the controller enhancement region 46. If there is no controller enhancement region 46, the mold compound 18 is formed underneath the passivation layer 78 and fills the opening 76 (not shown). The heat generated in the controller device region 44 may travel downward to a top portion of the mold compound 18 (through the controller enhancement region 46), especially to a portion underneath the active layer 52. It is therefore highly desirable for the mold compound 18 to have a high thermal conductivity, especially for a portion close to the active layer 52. The mold compound 18 may have a thermal conductivity between 1 W/m·K and 100 W/m·K, or between 7 W/m·K and 20 W/m·K. In addition, the mold compound 18 may have a low dielectric constant less than 8, or between 3 and 5 to yield low radio frequency (RF) coupling. The mold compound 18 may be formed of thermoplastics or thermoset polymer materials, such as polyphenylene sulfide (PPS), overmold epoxies doped with boron nitride, alumina, carbon nanotubes, or diamond-like thermal additives, or the like, and may have a thickness between 200 μm and 500 μm.

Figure 2:
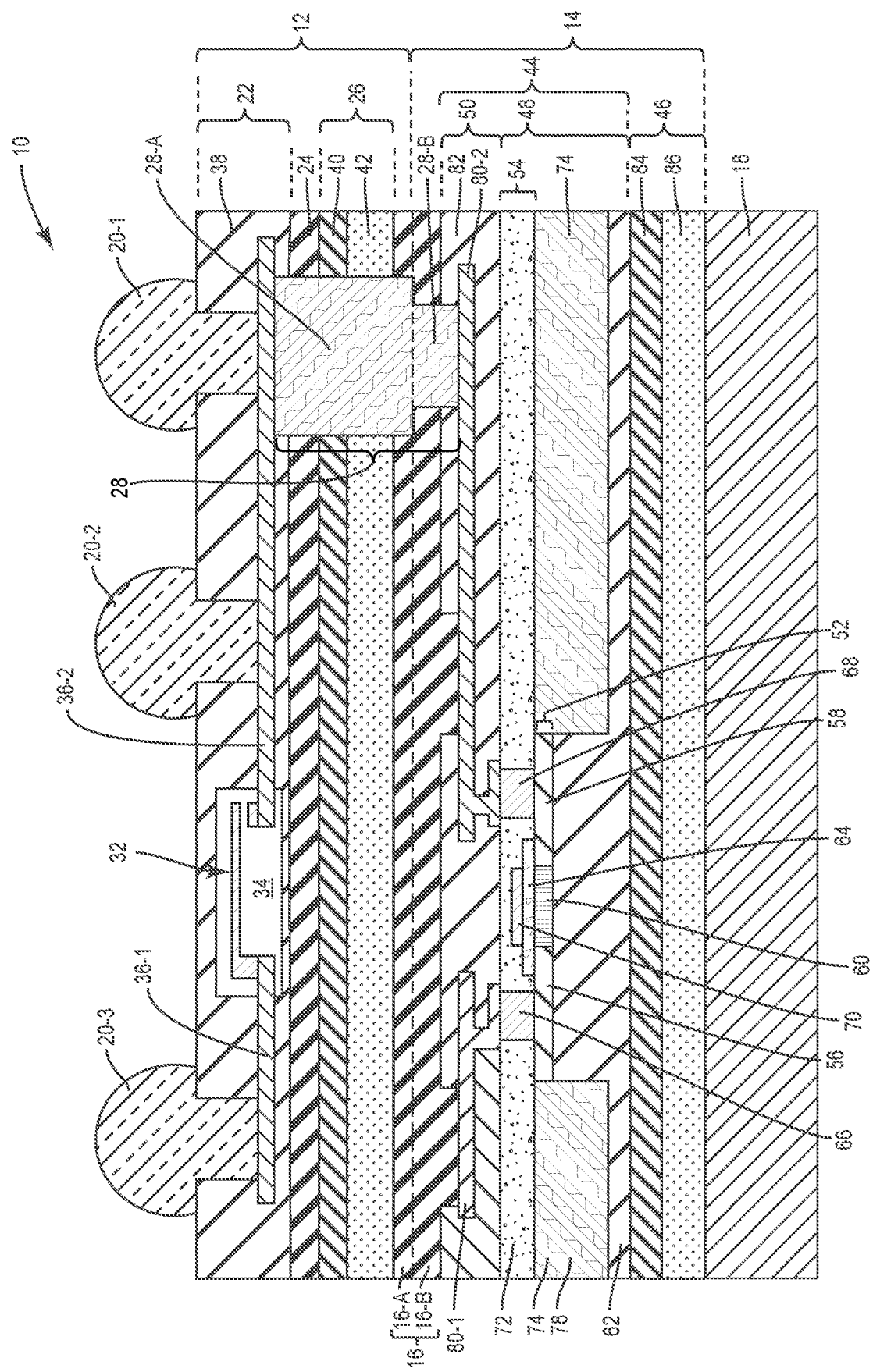
FIG. 2 illustrates an alternative microelectronics package according to one embodiment of the present disclosure.

In some applications, the controller device region 44 may be formed from a conventional complementary metal-oxide-semiconductor (CMOS) wafer, and the body 62 may extend vertically beyond the isolation sections 74, as illustrated in FIG. 2. As such, there is no opening 76 that resides within the isolation sections 74. In addition, a portion of the body 62 may extend underneath the bottom surfaces of the isolation sections 74. In this embodiment, the body 62 is thick enough, and there might not be a need to further passivate the active layer 52. The passivation layer 78 might be omitted, and the controller enhancement region 46 is formed directly underneath the body 62.

Figure 3:
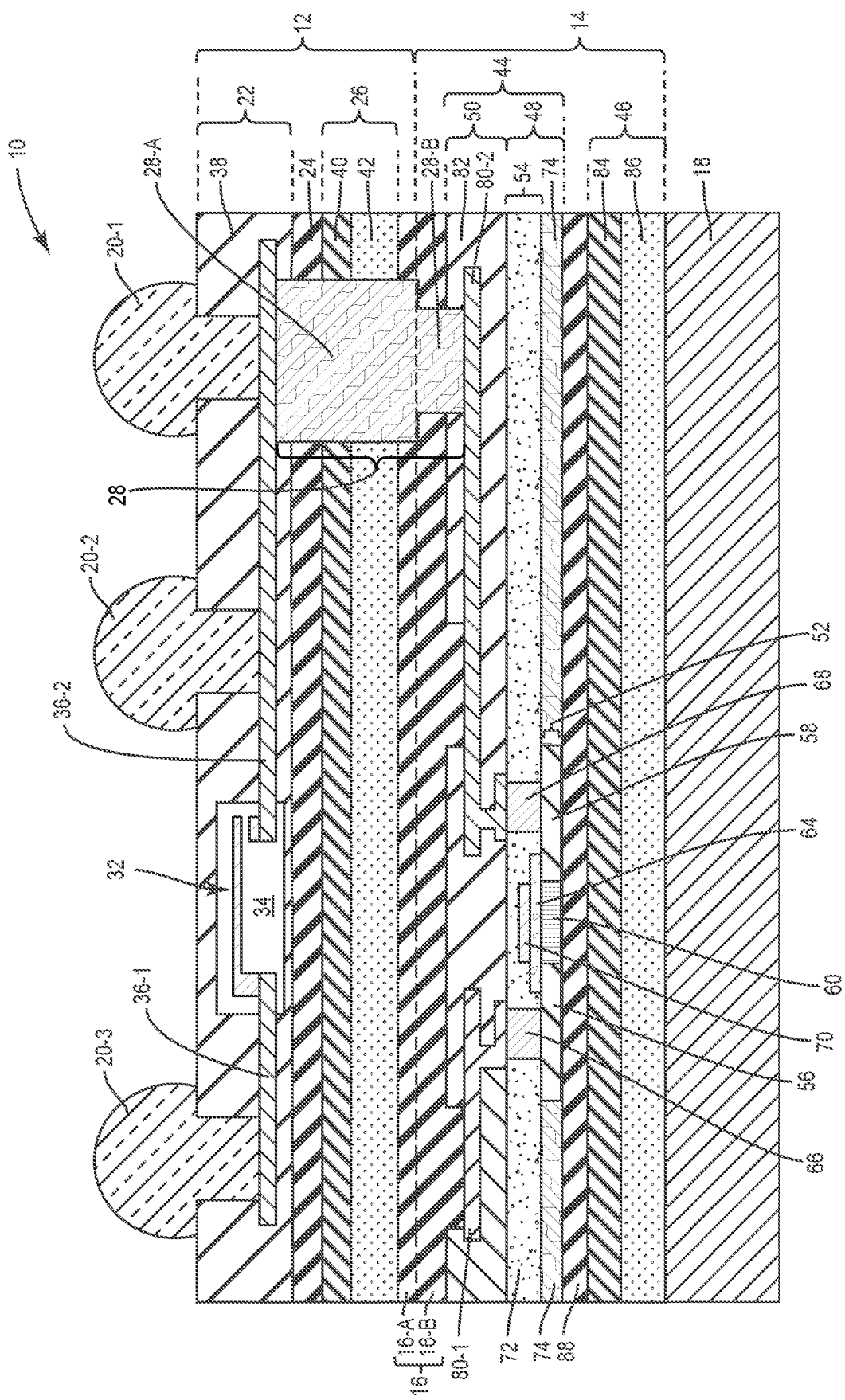
FIG. 3 illustrates an alternative microelectronics package according to one embodiment of the present disclosure.

In some applications, the controller device region 44 may be formed from a silicon-on-insulator (SOI) CMOS wafer, which includes a silicon epitaxy layer, a silicon substrate, and a buried oxide (BOX) layer sandwiched between the silicon epitaxy layer and the silicon substrate (not shown). The controller device region 44 is formed by fabricating device elements in or on the silicon epitaxy layer of the SOI CMOS wafer, and resides over an oxide layer 88 that is the BOX layer of the SOI CMOS wafer, as illustrated in FIG. 3. In this embodiment, the active layer 52 and the isolation sections 74 formed over the oxide layer 88, and the bottom surface of each isolation section 74 does not extend vertically beyond the bottom surface of the active layer 52, such that the opening 76 is omitted. In addition, the active layer 52 does not need an extra passivation layer, since the oxide layer 88 (which is formed of silicon oxide and formed underneath the active layer 52) passivates the active layer 52. The oxide layer 88 continuously covers the bottom surface of the active layer 52 and bottom surfaces of the isolation sections 74, the controller enhancement region 46 formed underneath the oxide layer 88.

FIGS. 4A-14 provide an exemplary wafer-level fabricating and packaging process that illustrates steps to manufacture the exemplary microelectronics package 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4A-14.

Figure 4A:
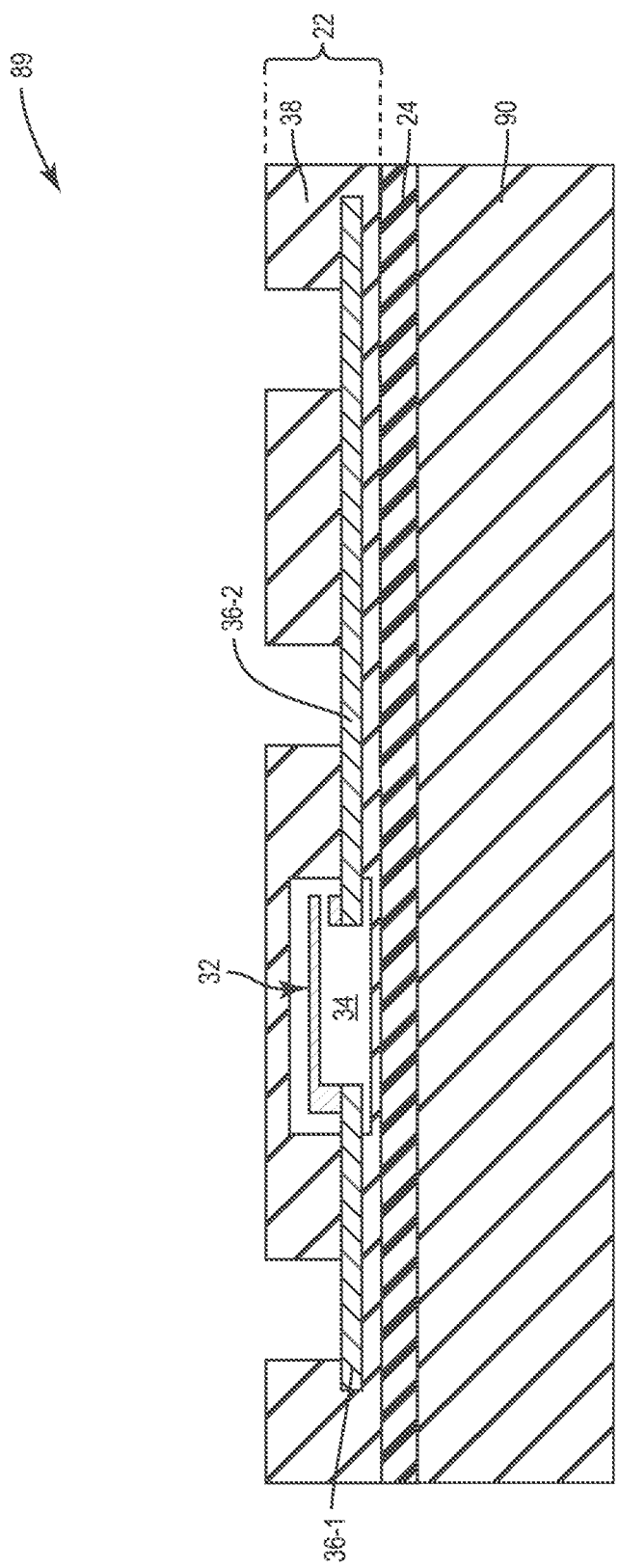

With reference to FIGS. 4A through 4I, a MEMS wafer which includes the MEMS device 12 is prepared for the microelectronics package 10. Initially, a starting MEMS wafer 89 is provided as illustrated in FIG. 4A. The starting MEMS wafer 89 includes the MEMS device region 22 at a top of the starting MEMS wafer 89, the stop layer 24 underneath the MEMS device region 22, and a MEMS handle substrate 90 underneath the stop layer 24. Herein, the MEMS device region 22 includes the MEMS component 32, the MEMS cavity 34, the MEMS connecting layers 36, and the MEMS dielectric layers 38. The MEMS cavity 34 is formed within the MEMS dielectric layers 38, and the MEMS component 32, typically a switch, is located in the MEMS cavity 34, such that the MEMS component 32 can be free to actuate. The MEMS connecting layers 36, which are configured to electrically connect the MEMS component 32 in the MEMS cavity 34 to external components outside the MEMS device region 22, are partially covered by the MEMS dielectric layers 38. For the purpose of this illustration, a top surface portion of the first MEMS connecting layer 36-1 and top surface portions of the second MEMS connecting layer 36-2 are exposed through the MEMS dielectric layers 38. In different applications, there might be more MEMS connecting layers 36 and more/fewer surface portions of the MEMS connecting layers 36 are exposed through the MEMS dielectric layers 38. The stop layer 24 extends over the entire bottom surface of the MEMS device region 22, so as to separate the MEMS device region 22 from the MEMS handle substrate 90. The MEMS handle substrate 90 may be formed of a conventional silicon with low cost.

Figure 4B:
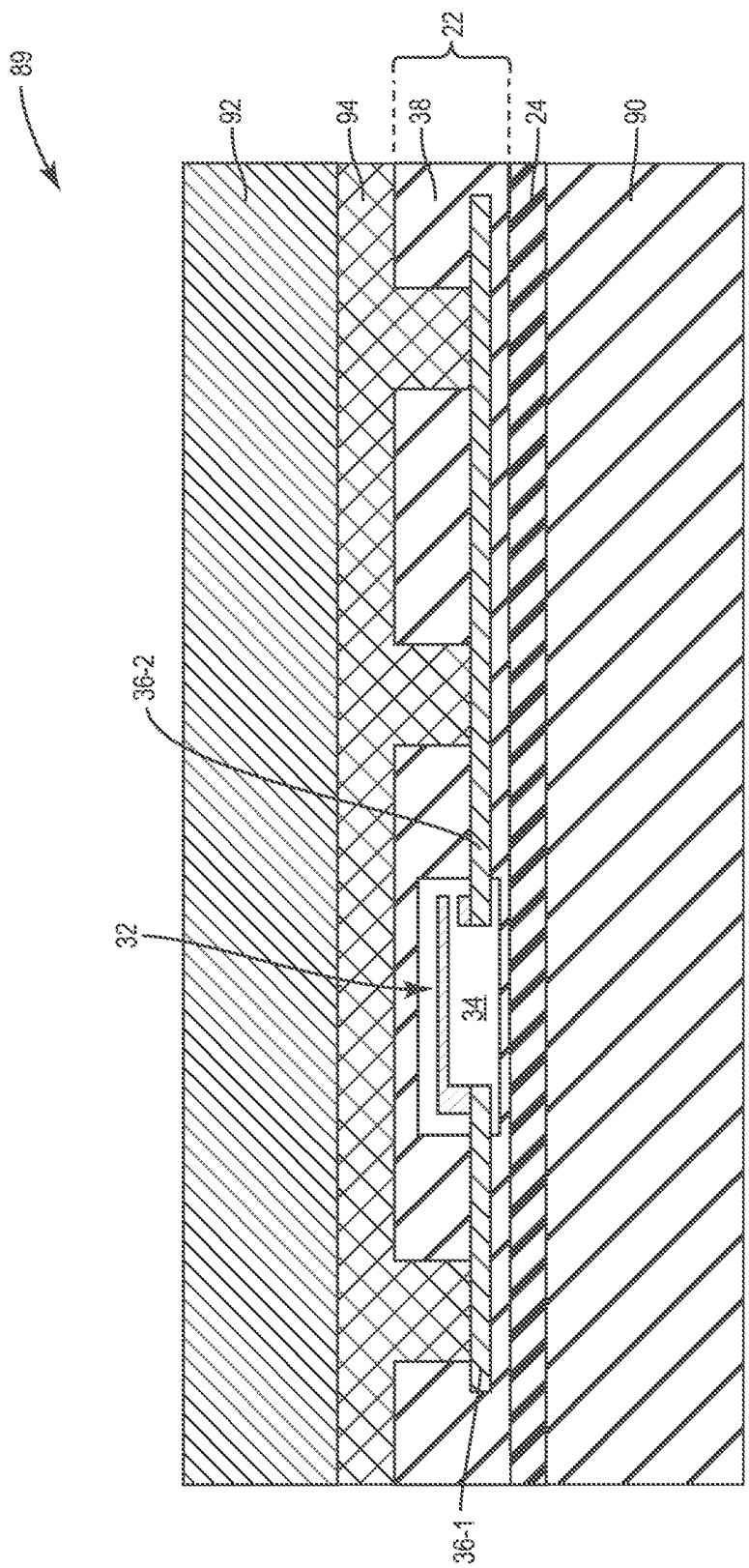

Next, the starting MEMS wafer 89 is then mounted to a temporary carrier 92, as illustrated in FIG. 4B. The starting MEMS wafer 89 may be mounted to the temporary carrier 92 via a mounting layer 94, which provides a planarized surface to the temporary carrier 92. The temporary carrier 92 may be a thick silicon wafer from a cost and thermal expansion point of view, but may also be constructed of glass, sapphire, or any other suitable carrier material. The mounting layer 94 may be a span-on polymeric adhesive film, such as the Brewer Science WaferBOND line of temporary adhesive materials.

Figure 4C:
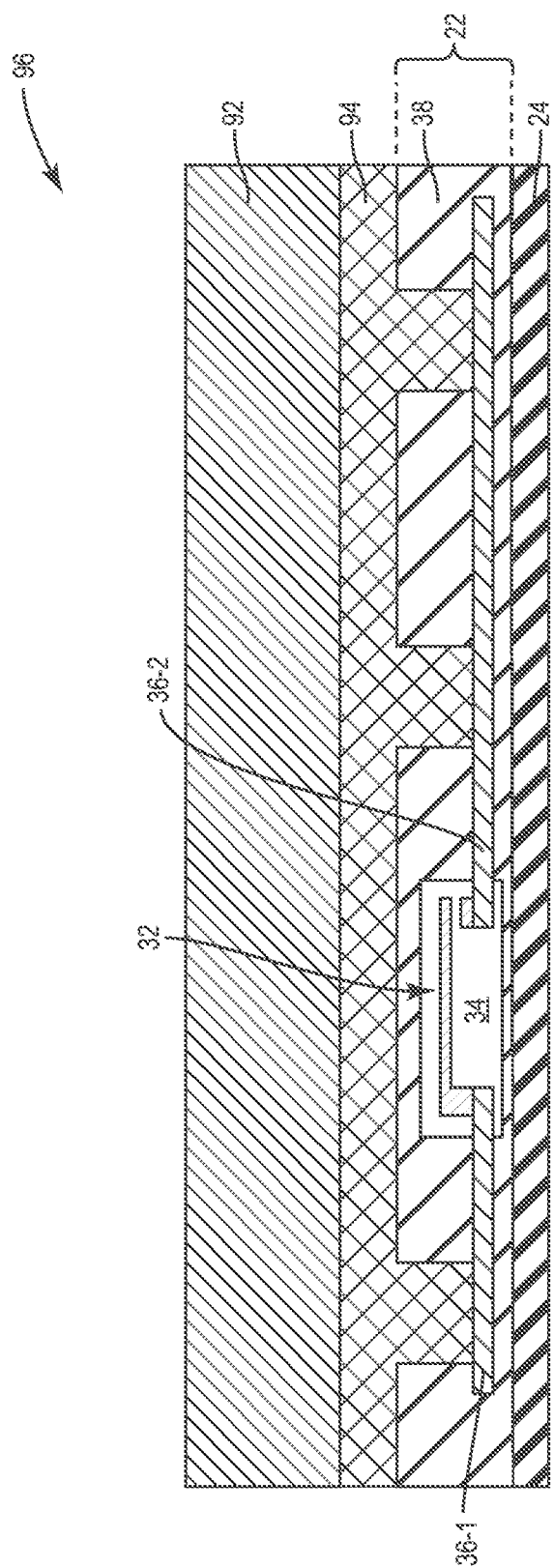

The MEMS handle substrate 90 is then selectively removed to provide an etched MEMS wafer 96, as illustrated in FIG. 4C. The selective removal may stop at the stop layer 24. Removing the MEMS handle substrate 90 may be provided by a mechanical grinding process and an etching process, or provided by the etching system itself. As an example, the MEMS handle substrate 90 may be ground to a thinner thickness to reduce the following etching time. An etching process is then performed to substantially remove the remaining MEMS handle substrate 90. Herein, substantially removing the remaining MEMS handle substrate 90 refers to removing the MEMS handle substrate until at most 50 µm or 20 µm of the MEMS handle substrate remains. In a desired case, the MEMS handle substrate may be completely removed. Since the MEMS handle substrate 90 and the stop layer 24 have different reactions to a same etching technique (for instance: different etching speeds with a same etchant), the etching system may be capable of identifying the presence of the stop layer 24, and capable of indicating when to stop the etching process. The etching process may be provided by a wet etching system with an etchant chemistry, which is at least one of TMAH, KOH, NaOH, ACH, and XeF$_2$, or a dry etching system, such as a reactive ion etching system with a chlorine-based gas chemistry or a fluorine-based gas chemistry. During the removal process, the mounting layer 94 and the temporary carrier 92 protect the MEMS device region 22.

Figure 4D:
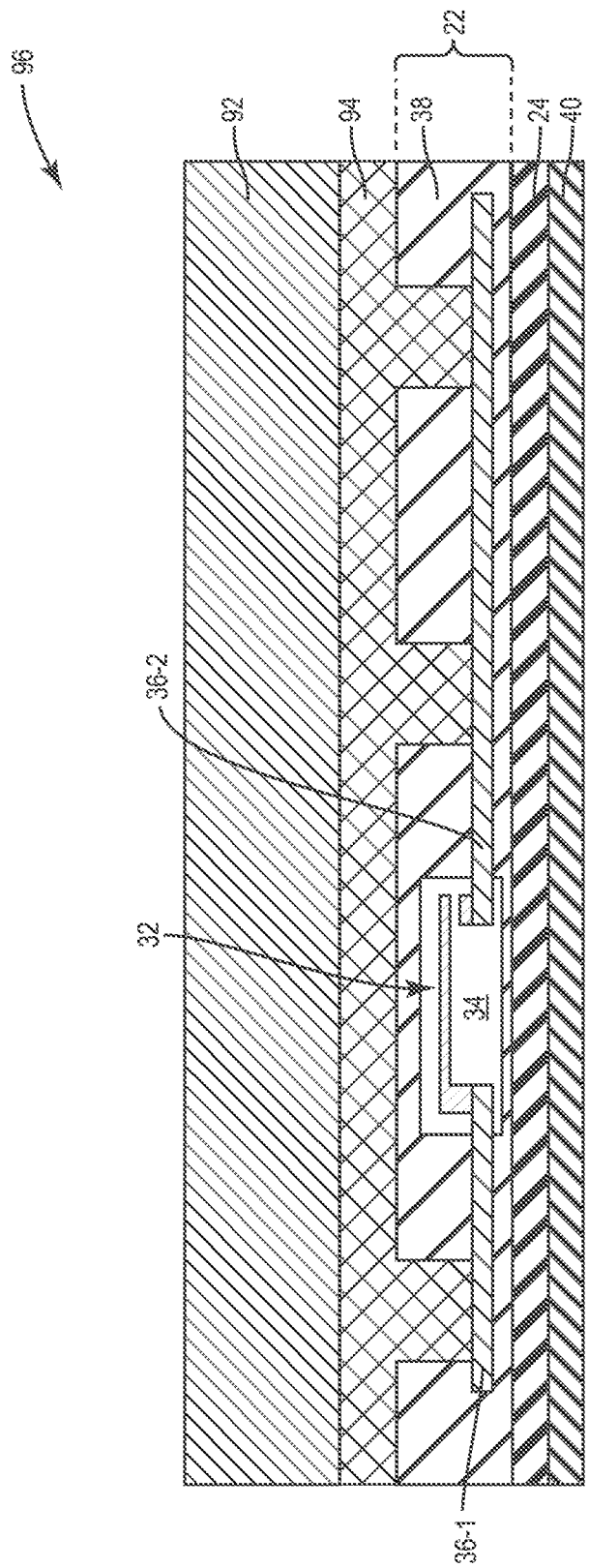

After the substantial removal of the MEMS handle substrate 90, the MEMS barrier layer 40 is applied underneath the stop layer 24, as illustrated in FIG. 4D. If a thin portion of the MEMS handle substrate 90 is remained, the MEMS barrier layer 40 may be directly applied underneath the remained MEMS handle substrate 90 (not shown). If there is no MEMS handle substrate remained, the MEMS barrier layer 40 may be directly formed underneath the stop layer 24. In one embodiment, the MEMS barrier layer 40 covers an entire bottom surface of the stop layer 24. The MEMS barrier layer 40 is formed of silicon nitride with a thickness between 2000 Å and 10 µm. The MEMS barrier layer 40 is configured to provide a superior barrier to moisture and impurities, which could diffuse into the MEMS cavity 34 and cause reliability concerns to the MEMS component 32. Moisture, for example, may diffuse readily through a silicon oxide layer (like the stop layer 24), but even a thin nitride layer (like the MEMS barrier layer 40) reduces the diffusion of the water molecule by several orders of magnitude, acting as an ideal barrier. In addition, the MEMS barrier layer 40 may also be engineered so as to provide additional tensile strain to the MEMS device region 22. Such strain may be beneficial in providing minimal warpage of the stacked layers. Furthermore, the MEMS barrier layer 40 may also provide thermal benefit to the MEMS device region 22. The MEMS barrier layer 40 may be formed by a chemical vapor deposition system such as a plasma enhanced chemical vapor deposition (PECVD) system, or an atomic layer deposition system, such as plasma enhanced atomic layer deposition (PEALD) system.

Figure 4E:
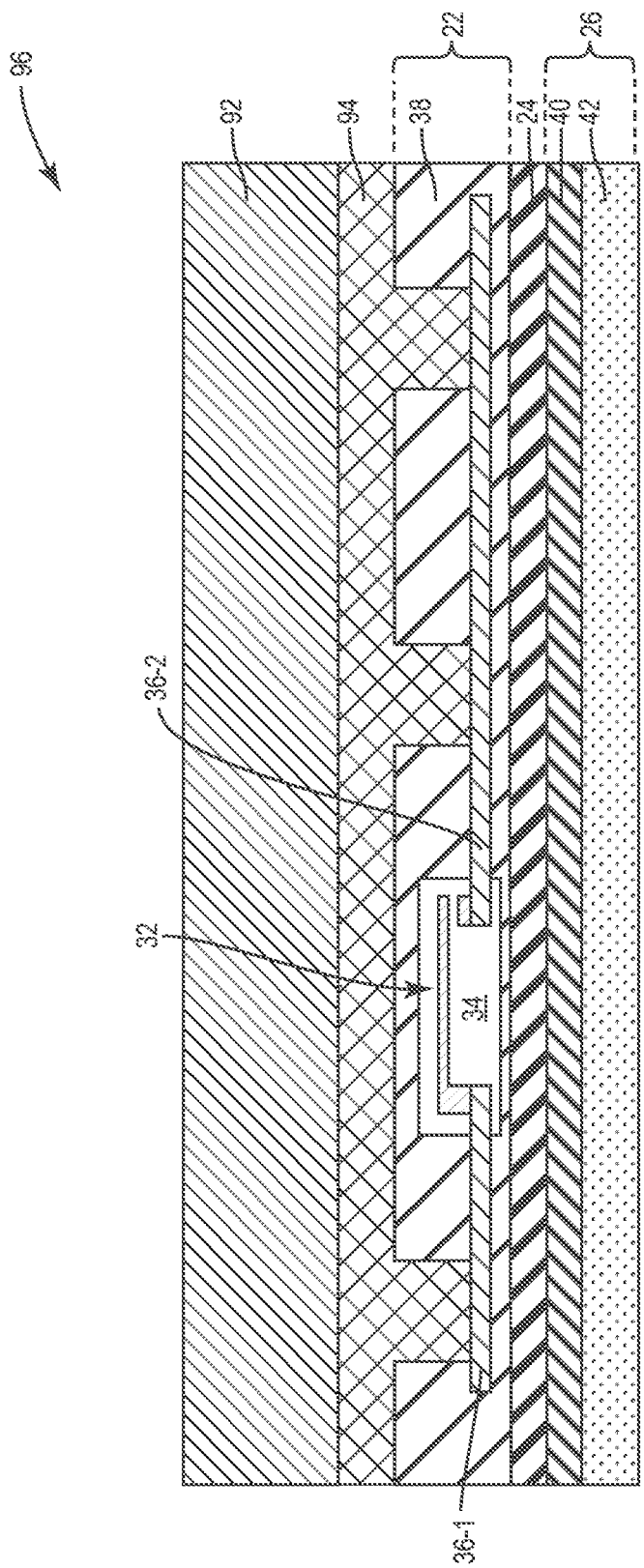

The MEMS thermally conductive layer 42 is then applied underneath the MEMS barrier layer 40 to form the MEMS enhancement region 26, as illustrated in FIG. 4E. The MEMS thermally conductive layer 42, which may be formed of aluminum nitride with a thickness between 0.1 µm and 20 µm, could provide superior thermal dissipation for the MEMS device region 22, in the order of 275 W/mk while retaining superior electrically insulating characteristics. If power dissipation is not of a concern of a final product, then the MEMS thermally conductive layer 42 may be omitted (not shown). In some applications, the entire MEMS enhancement region 26 might be omitted (not shown), or the MEMS barrier layer 40 might be omitted while the MEMS thermally conductive layer 42 might be applied directly underneath the stop layer 24 (not shown). The MEMS thermally conductive layer 42 may be formed by Chemical vapor deposition (CVD), atomic layer deposition system (ALD), or other similar methods known to those skilled in the art of semiconductor processing.

Figure 4F:
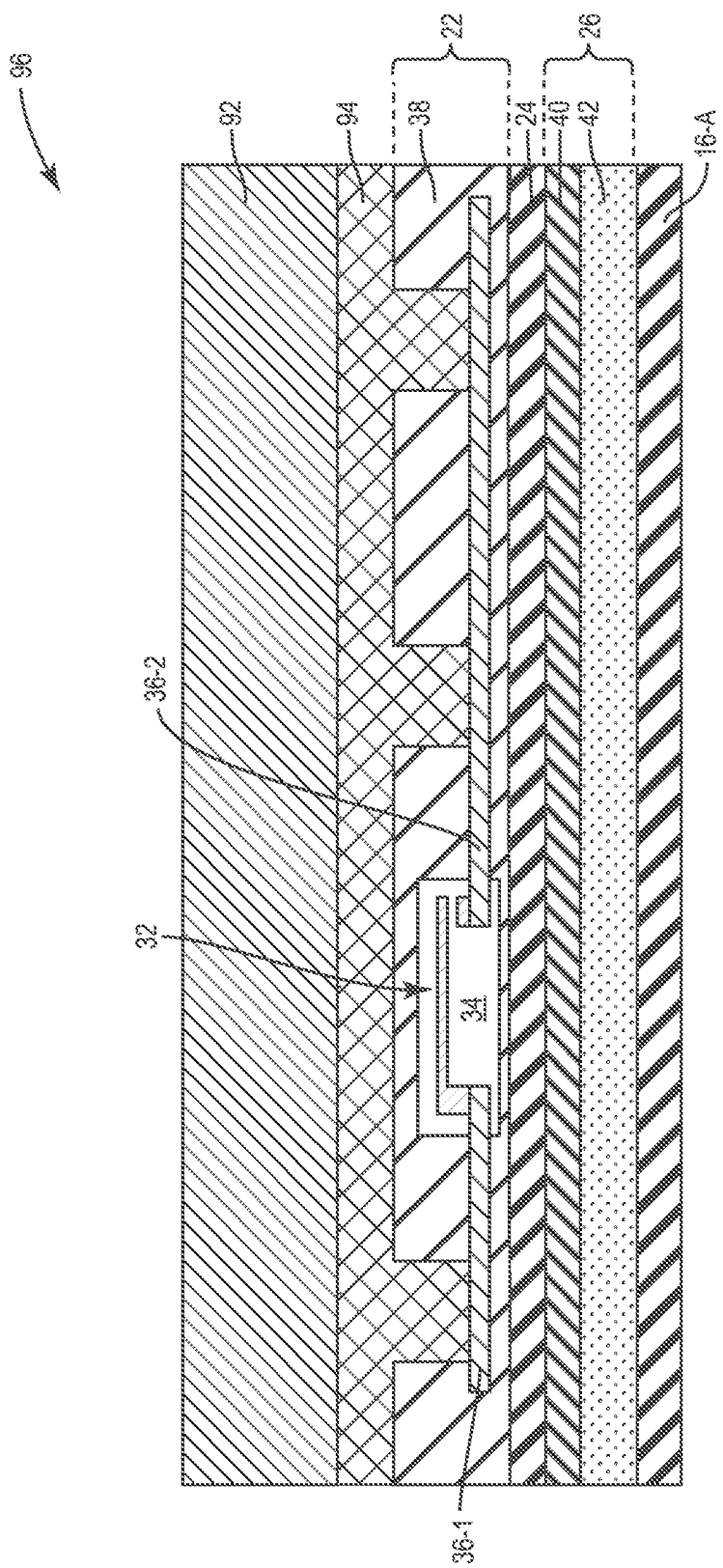

If the MEMS enhancement region 26 (including the MEMS barrier layer 40 and/or the MEMS thermally conductive layer 42) is applied underneath the stop layer 24, it is necessary to add the MEMS bonding layer 16-A underneath the MEMS enhancement region 26, as illustrated in FIG. 4F. The MEMS bonding layer 16-A is configured to be used at a later part of the process to connect to a controller wafer. The MEMS bonding layer 16A may be formed of silicon oxide, and is engineered to have a proper thickness for subsequent planarization and bonding steps. If the entire MEMS enhancement region 26 is omitted, there might not be a need for the MEMS bonding layer 16-A, since the stop layer 24 may also be used for bonding to the controller wafer.

Figure 4G:
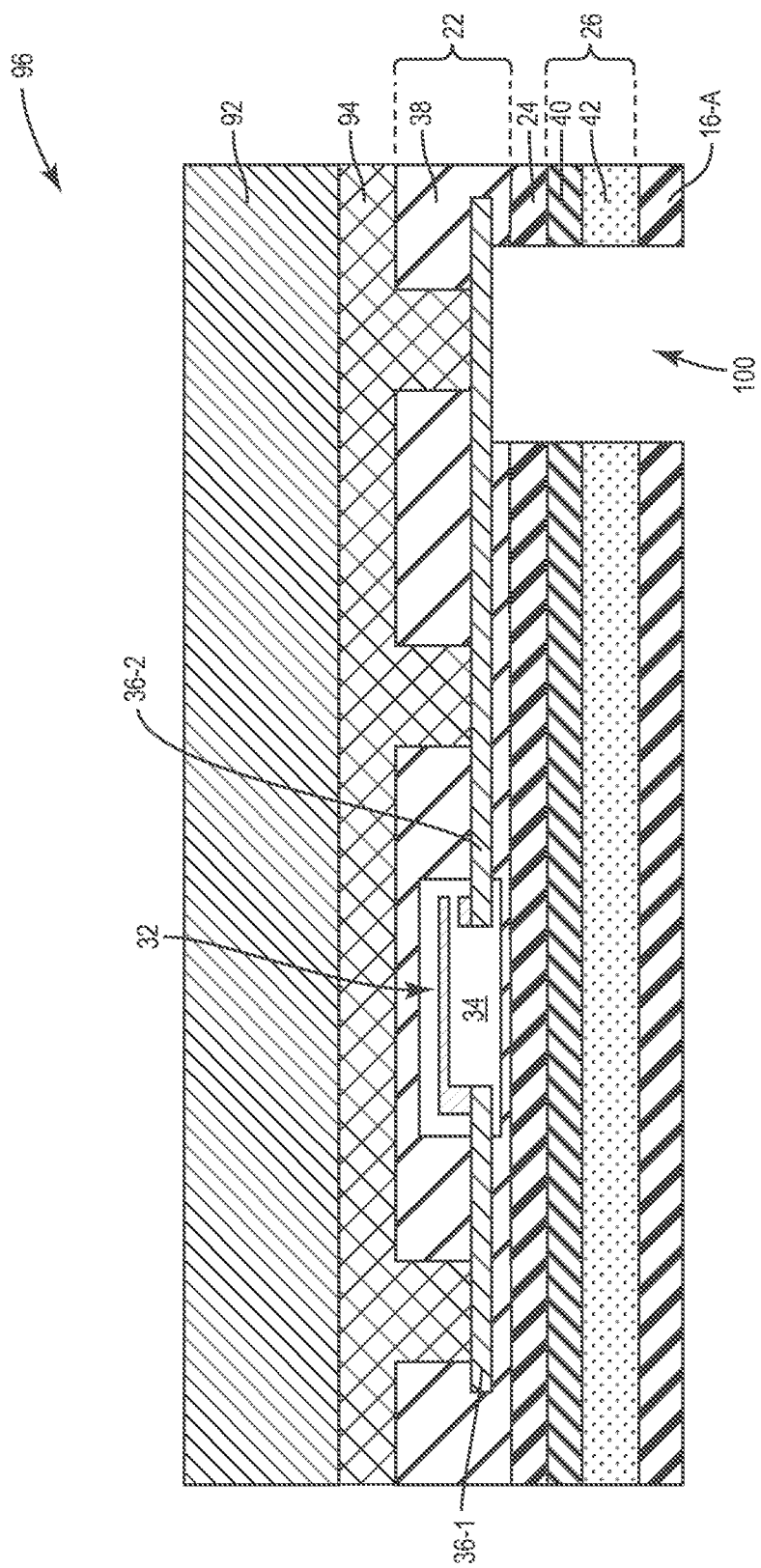

Next, a MEMS via cavity 100 is formed through the MEMS bonding layer 16-A, the MEMS enhancement region 26, and the stop layer 24, and extends into the MEMS device region 22 to expose a bottom surface portion of the second MEMS connecting layer 36-2, as illustrated in FIG. 4G. The MEMS via cavity 100 does not extend through or into the portions of the MEMS device region 22 where the MEMS cavity 34 and the MEMS component 32 are located. The MEMS via cavity 100 may have a shape of a cuboid, a polygon, a cylinder, or a cone and has a depth greater than a thickness combination of the MEMS bonding layer 16-A, the MEMS enhancement region 26, and the stop layer 24. The MEMS via cavity 100 may be formed by a photo masking process and an etching process. The etching process is designed to be selective to metals, which means the etching process proceeds (removing portions of the MEMS bonding layer 16-A, the MEMS enhancement region 26, and the stop layer 24) until the second MEMS connecting layer 36-2 is reached.

Figure 4H:
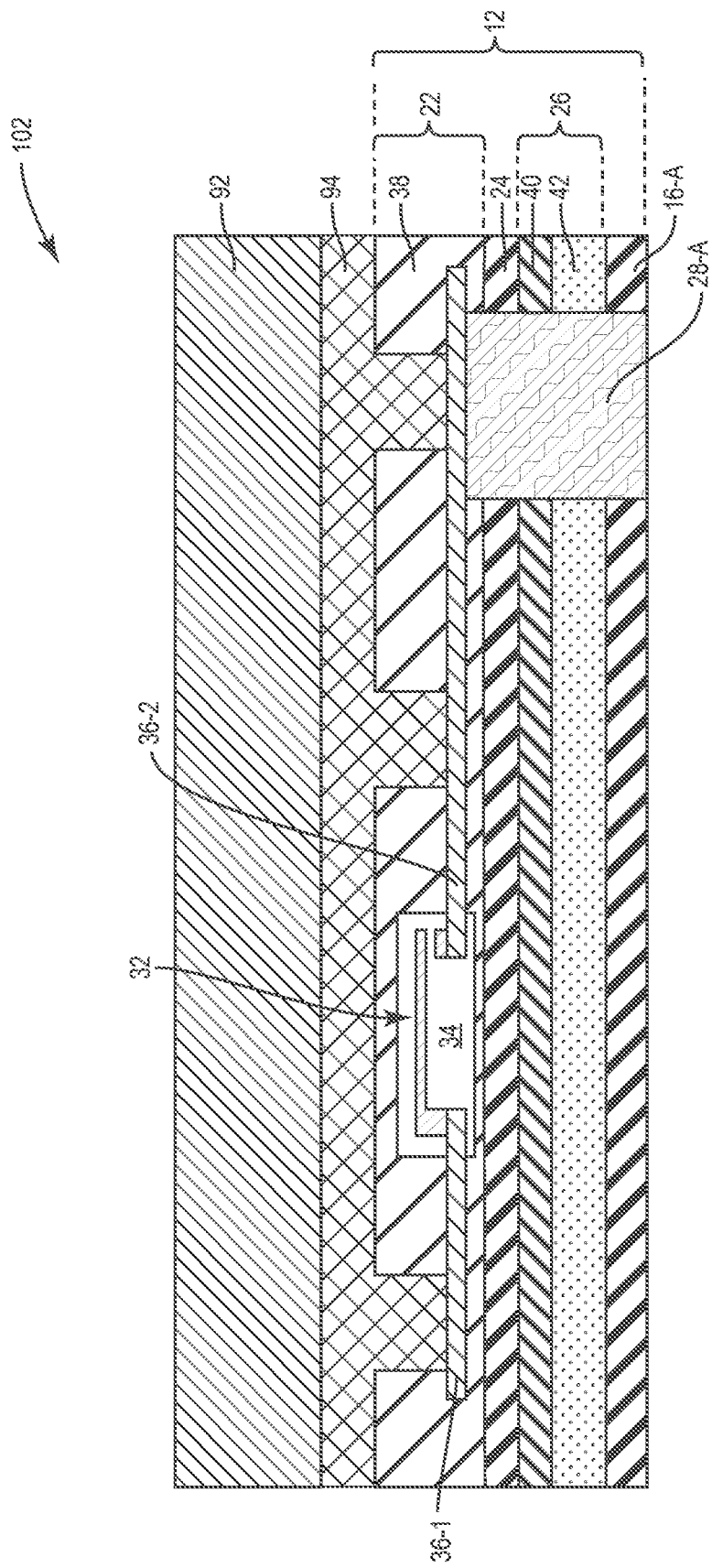

The MEMS through-via 28-A is then formed in the MEMS via cavity 100 to complete a MEMS wafer 102 including the MEMS device 12, as illustrated in FIG. 4H. The MEMS through-via 28-A may be formed by filling the MEMS via cavity 100 with one or more appropriate materials. The appropriate material is required to be electrically conductive, such as platinum, gold, silver, copper, aluminum, tungsten, titanium, electrically conductive epoxy, or other suitable materials.

Figure 4I:
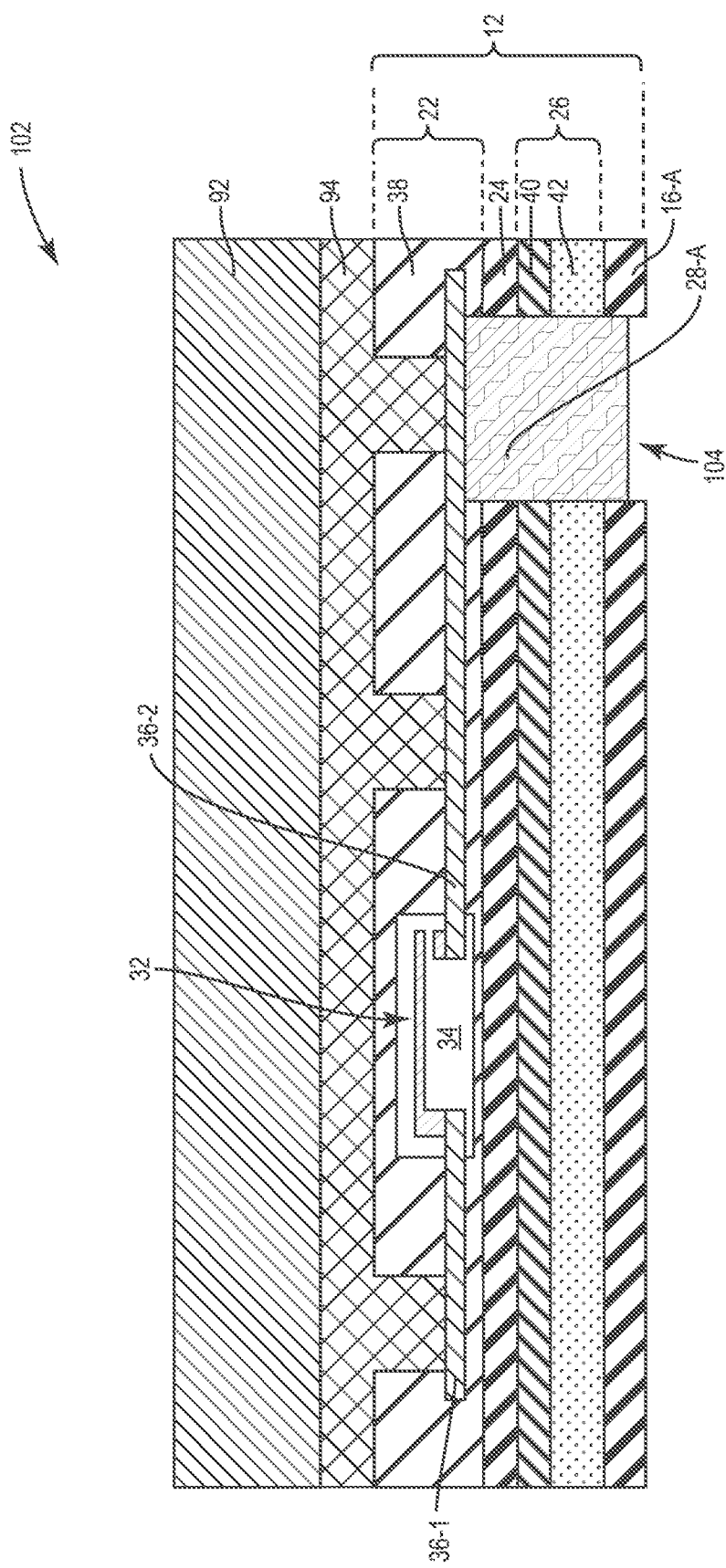

For defect-free and void-free wafer slice bonding, a backside of the MEMS wafer 102 need to be planarized with a nano-meter range flatness. Chemical mechanical polishing (CMP) technology may be utilized in the planarization process. Since the backside of the MEMS wafer 102 contains regions of both silicon oxide (the MEMS bonding layer 16-A) and electrically conductive material (the MEMS through-via 28-A), a combination of different CMP slurries and wheels may be necessary. If the MEMS through-via 28-A is formed of copper and will be bonded to another copper via using hybrid copper-copper bonding, it is desirable that the MEMS through-via 28-A be recessed by an appropriate amount compared to the MEMS bonding layer 16-A, as illustrated in FIG. 4I. Such recess 104 (from a planarized bottom surface of the MEMS bonding layer 16-A to a planarized bottom surface of the MEMS through-via 28-A) has a depth between 0.2 nm and 200 nm. This can be accomplished with a proper choice of copper/oxide slurries.

Figure 5A:
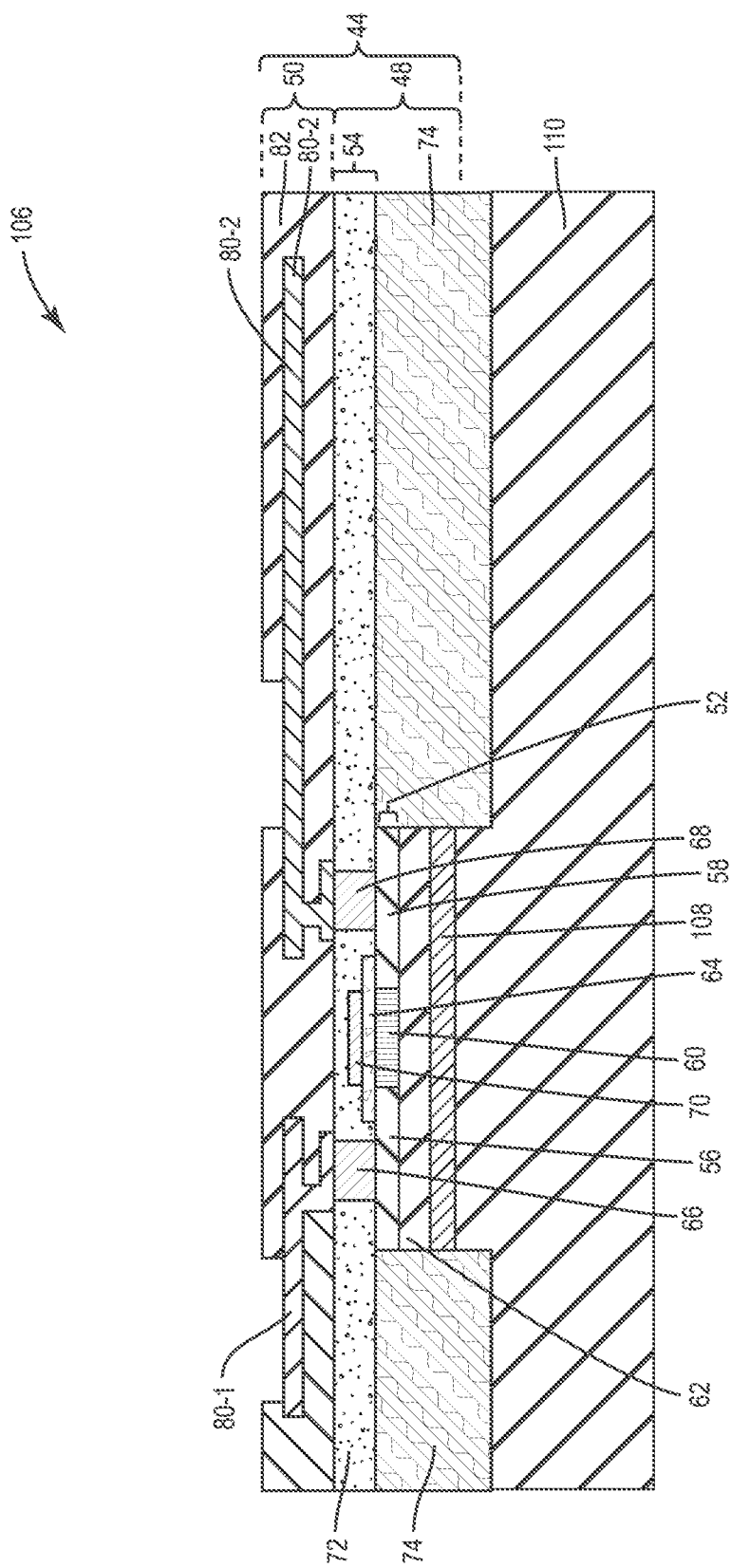

With reference to FIGS. 5A through 5E, a controller wafer which includes the controller device region 44 is prepared for the microelectronics package 10. Initially, a starting controller wafer 106 is provided as illustrated in FIG. 5A. The starting controller wafer 106 includes the controller device region 44 with the FEOL portion 48 and the BEOL portion 50, an interfacial layer 108, and a controller handle substrate 110.

The BEOL portion 50 is formed over the FEOL portion 48 and includes the controller connecting layers 80 formed within the controller dielectric layers 82. The controller connecting layers 80 may have one or more top portions not covered by the controller dielectric layers 82, such that the controller connecting layers 80 may be electrically connected to external components not within the starting controller wafer 106.

The FEOL portion 48, which may be configured to provide a switch FET for component controlling, includes the active layer 52 and the contact layer 54. The active layer 52 may include the source 56, the drain 58, and the channel 60 between the source 56 and the drain 58. In some applications, there might be the body 62 residing underneath the active layer 52. The body 62 may be formed of silicon with a thickness between 10 nm and 500 nm.

The contact layer 54, which is formed underneath the BEOL portion 50 and over the active layer 52, is configured to connect the active layer 52 to the BEOL portion 52. The contact layer 54 includes the gate structure 64, the source contact 66, the drain contact 68, and the gate contact 70. The gate structure 64 may be formed of silicon oxide, and extends horizontally over the channel 60 (i.e., from over the source 56 to over the drain 58). The source contact 66 is connected to and over the source 56, the drain contact 68 is connected to and over the drain 58, and the gate contact 70 is connected to and over the gate structure 64. The insulating material 72 may be formed around the source contact 66, the drain contact 68, the gate structure 64, and the gate contact 70 to electrically separate the source 56, the drain 58, and the gate structure 64. For the purpose of this illustration, the first controller connecting layer 80-1 in the BEOL 50 is connected to the source contact 66 and the second controller connecting layer 80-2 of the BEOL 50 is connected to the drain contact 68. In different applications, the FEOL portion 48 may have different FET configurations or provide different device components for controlling.

In addition, the FEOL portion 48 also includes the isolation sections 74, which reside underneath the insulating material 72 of the contact layer 54 and surround the active layer 52 (also surround the body 62 if the body 62 exists). The isolation sections 74 are configured to electrically separate the active layer 52 from other devices formed in the common controller wafer 106 (not shown). Herein, the isolation sections 74 may extend from the bottom surface of the contact layer 54 and vertically beyond the bottom surface of the active layer 52 (and beyond the body 62 if the body 62 exists). The isolation sections 74 may be formed of silicon dioxide, which may be resistant to etching chemistries such as tetramethylammonium hydroxide (TMAH), xenon difluoride ($XeF_2$), potassium hydroxide (KOH), sodium hydroxide (NaOH), or acetylcholine (ACH), and may be resistant to a dry etching system, such as a reactive ion etching (RIE) system with a chlorine-based gas chemistry.

The interfacial layer 108 resides underneath the active layer 52 (underneath the body 62 if the body 62 exists) and is surrounded by the isolation sections 74. In one embodiment, the bottom surfaces of the isolation section 74 may extend vertically beyond a bottom surface of the interfacial layer 108. The controller handle substrate 110 resides underneath the interfacial layer 108, and portions of the controller handle substrate 110 may extend underneath the isolation sections 74. As such, the interfacial layer 108 and the isolation sections 74 separate the active layer 52 and the controller handle substrate 110. The interfacial layer 108 may be formed of silicon germanium (SiGe), and the controller handle substrate 110 may be formed of a conventional silicon with low cost.

Figure 5B:
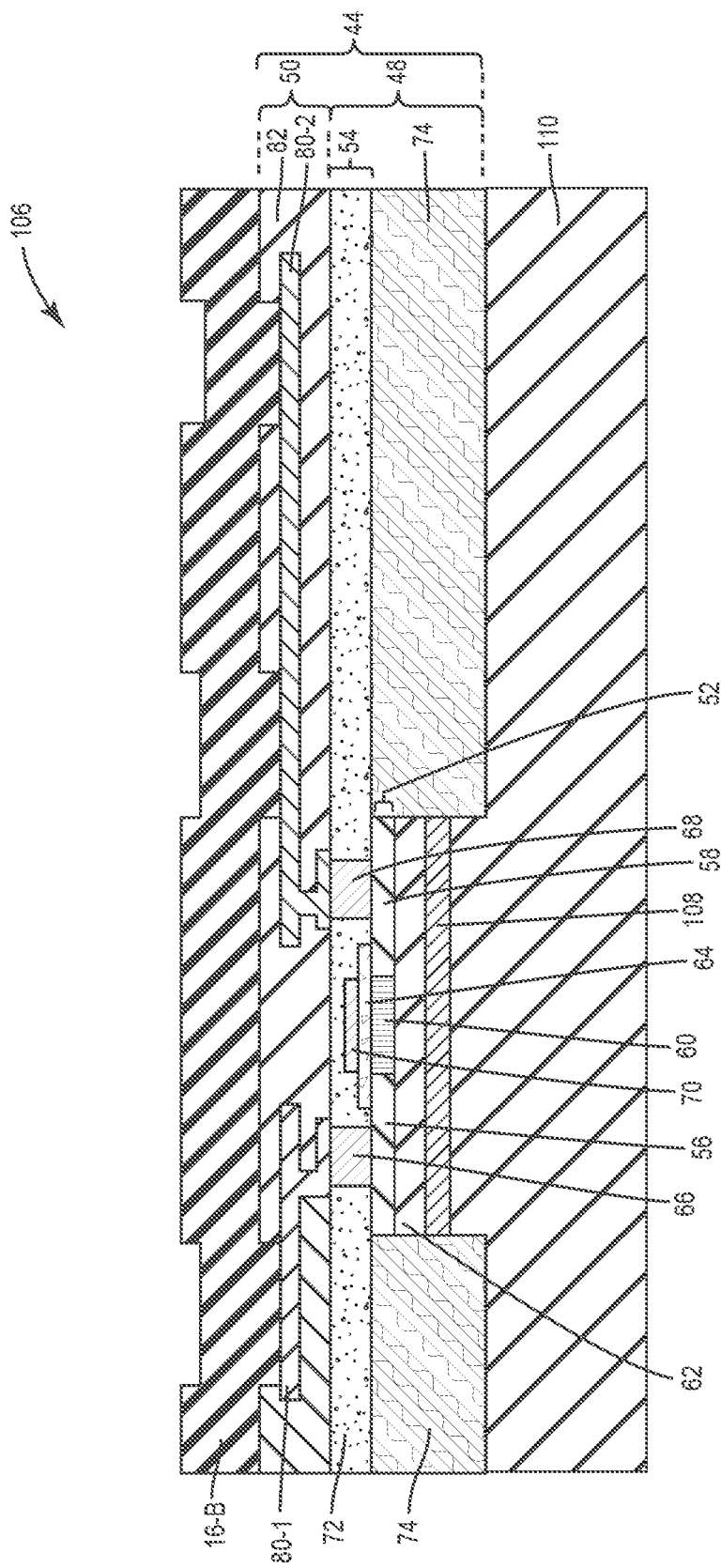

Next, the controller bonding layer 16-B is formed over the BEOL portion 50 of the controller device region 44, as illustrated in FIG. 5B. The controller bonding layer 16-B is formed of a same material as the MEMS bonding layer 16-A, such as silicon oxide. The controller bonding layer 16-B is engineered to have a proper thickness for subsequent planarization and bonding steps.

Figure 5C:
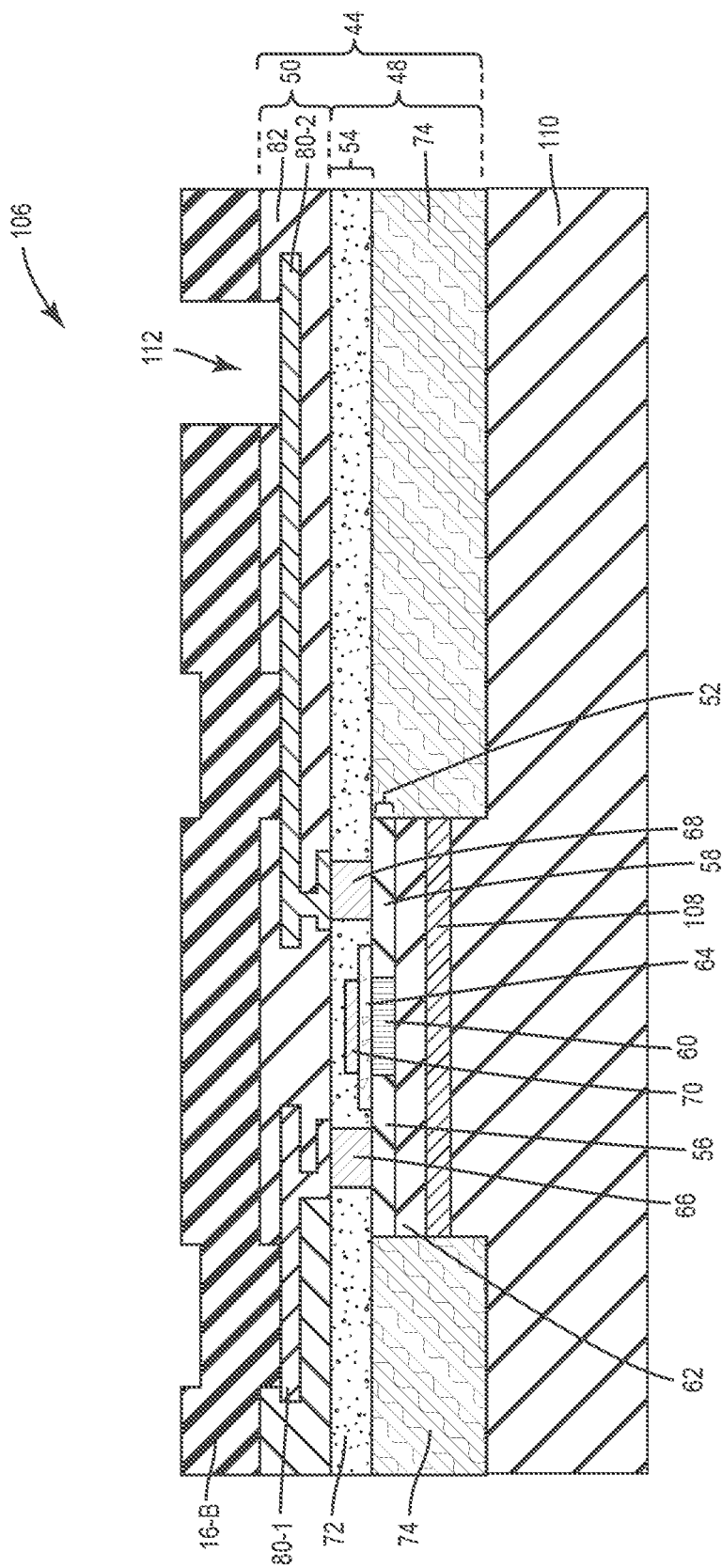

A controller via cavity 112 is then formed through the controller bonding layer 16-B, and extends into the BEOL portion 50 of the controller device region 44 to expose a top surface portion of the second controller connecting layer 80-2, as illustrated in FIG. 5C. The controller via cavity 112 does not extend toward or into the portions of the controller device region 44 where the switch FET (the active layer 52) provided in the FEOL portion 48 is located. The controller via cavity 112 may have a shape of a cuboid, a polygon, a cylinder, or a cone and has a depth greater than a thickness of the controller bonding layer 16-B. The controller via cavity 112 may be formed by a photo masking process and an etching process. The etching process is designed to be selective to metals, which means the etching process removes portions of the controller bonding layer 16-B (and maybe portions of controller dielectric layers 82) until the second controller connecting layer 80-2 is reached.

Figure 5D:
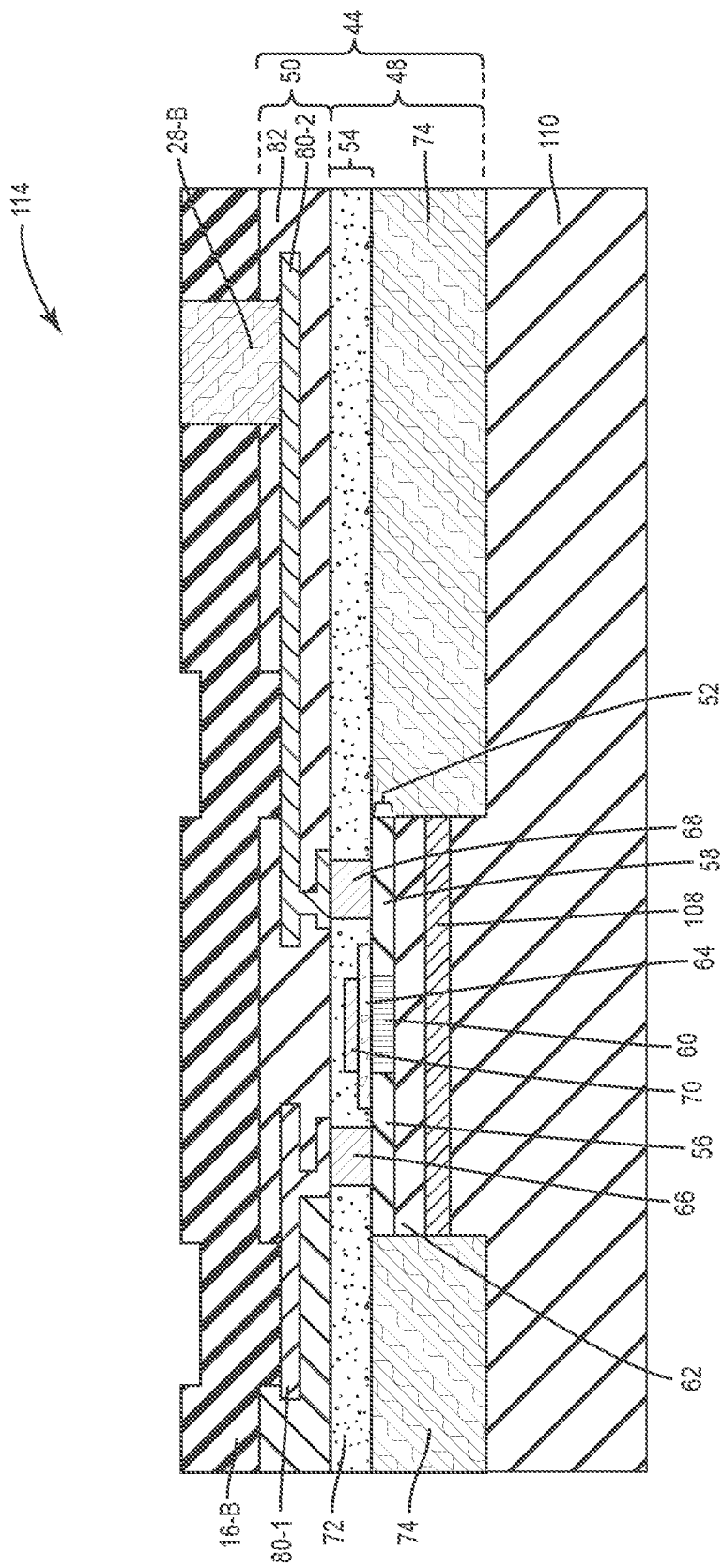

The controller through-via 28-B is formed in the controller via cavity 112 to complete a controller wafer 114 including the controller device region 44, as illustrated in FIG. 5D. The controller through-via 28-B may be formed by filling the controller via cavity 112 with one or more appropriate materials. The appropriate material is required to be electrically conductive, such as platinum, gold, silver, copper, aluminum, tungsten, titanium, electrically conductive epoxy, or other suitable materials.

Figure 5E:
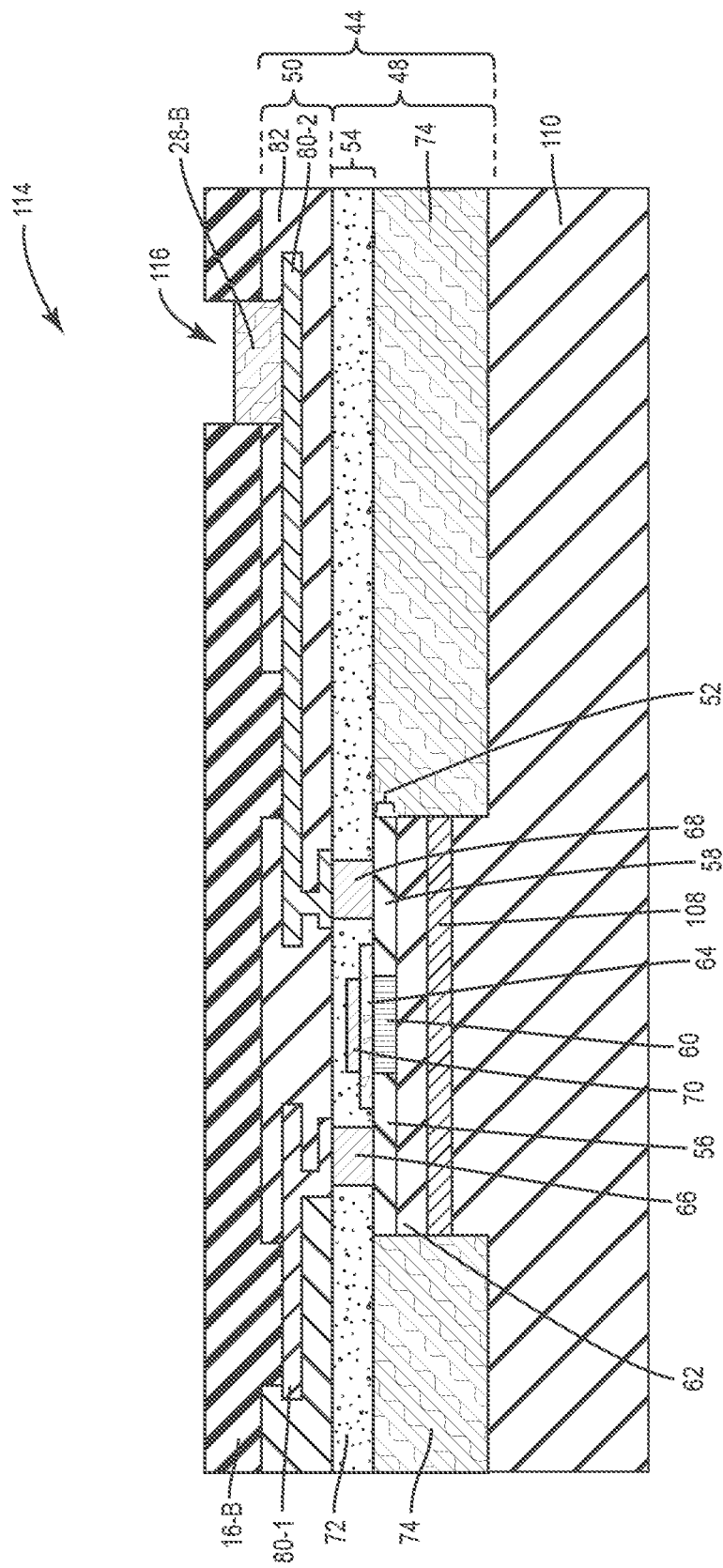

For defect-free and void-free wafer slice bonding, a topside of the controller wafer 114 needs to be planarized with a nano-meter range flatness, as illustrated in FIG. 5E. The CMP technology may be utilized in the planarization process. Since the topside of the controller wafer 114 contains regions of both silicon oxide (the controller bonding layer 16-B) and electrically conductive material (the controller through-via 28-B), a combination of different CMP slurries and wheels may be necessary. If the controller through-via 28-B is formed of copper and will be bonded to the MEMS through-via 28-A using hybrid copper-copper bonding, it is desirable that the controller through-via 28-B be recessed by an appropriate amount compared to the controller bonding layer 16-B. Such recess 116 (from a planarized top surface of the controller bonding layer 16-B to a planarized top surface of the controller through-via 28-B) has a depth between 0.2 nm and 200 nm. This can be accomplished with a proper choice of copper/oxide slurries.

Figure 6:
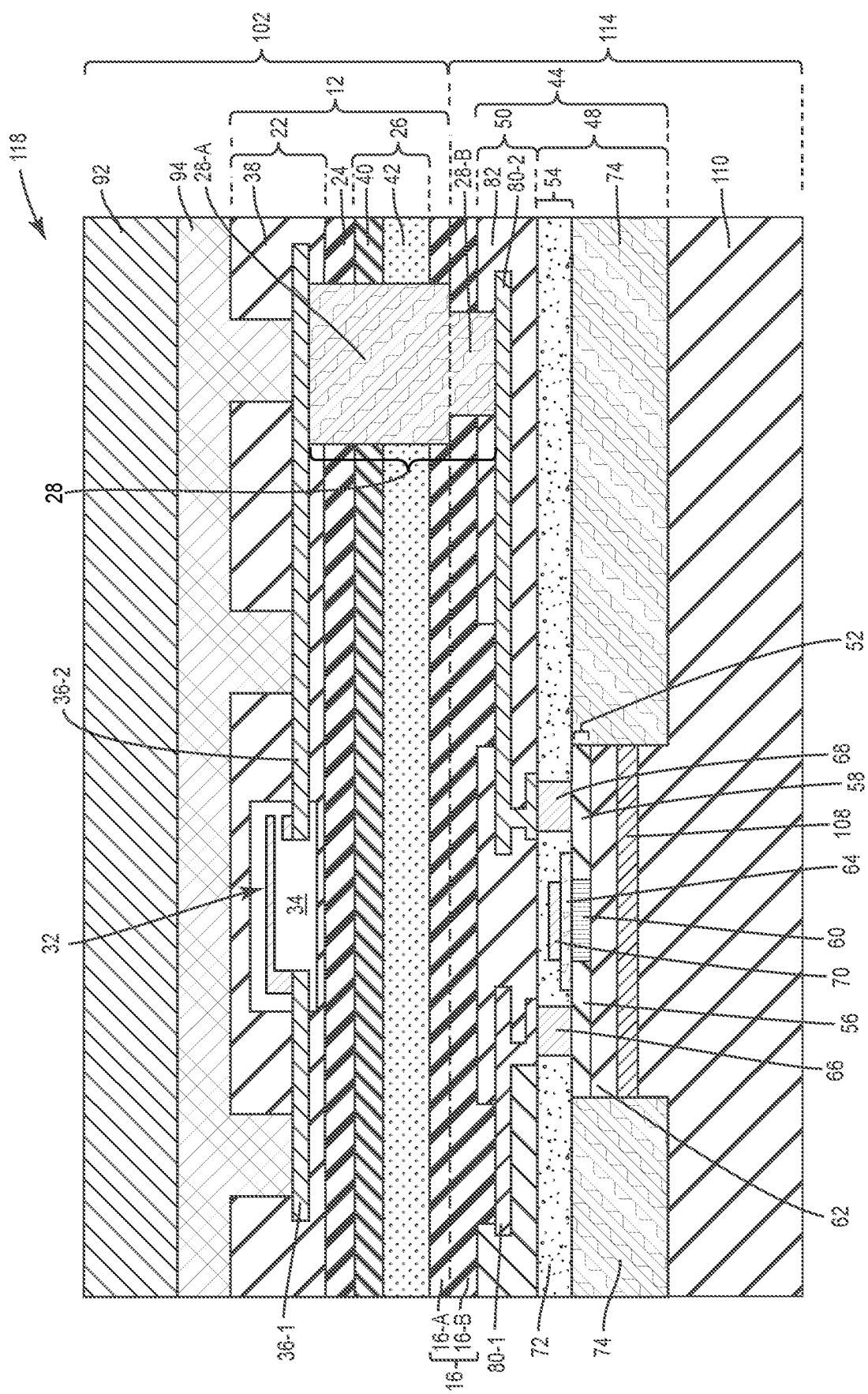

After the MEMS wafer 102 and the controller wafer 114 are formed, a bonding step is applied to form a precursor package 118, as illustrated in FIG. 6. The MEMS wafer 102 is placed over the controller wafer 114, such that the bottom surface of the MEMS bonding layer 16-A directly faces the top surface of the controller bonding layer 16-B. Suitable wafer alignment tools may be used to align the MEMS wafer 102 with the controller wafer 114, such that the MEMS through-via 28-A in the MEMS wafer 102 is vertically aligned with the controller through-via 28-B in the controller wafer 114.

A number of different methods may be utilized to implement the bonding step, and one of them is called direct bonding (DB) process. In the DB process, first bonding is achieved between the MEMS bonding layer 16-A and the controller bonding layer 16-B at a room temperature. Since the bottom surface of the MEMS bonding layer 16-A of the MEMS wafer 102 and the top surface of the controller bonding layer 16-B of the controller wafer 114 are properly planarized (flat enough in nano meter range), when the MEMS wafer 102 and the controller wafer 114 are brought together, an intimate connection will exist between the MEMS bonding layer 16-A and the controller bonding layer 16-B. Then second bonding between the MEMS through-via 28-A in the MEMS wafer 102 and the controller through-via 28-B in the controller wafer 114 could be achieved by careful heating cycles. If the MEMS through-via 28-A and the controller through-via 28-B are formed of copper, the heating cycles compress the copper-copper metal joints and create a high quality copper-copper low resistance bond. The MEMS through-via 28-A and the controller through-via 28-B are bonded directly together to form the through-via structure 28. As such, the switch FET provided in the controller device region 44 could control the MEMS component 32 in the MEMS device region 22 through the second controller connecting layer 80-2, the through-via structure 28, and the second MEMS connecting layer 36-2.

Notice that, between the MEMS device region 22 in the MEMS wafer 102 and the controller device region 44 in the controller wafer 114, there are the bonding region 16 (the MEMS bonding layer 16-A and the controller bonding layer 16-B), optionally the MEMS enhancement region 26 (the MEMS barrier layer 40 and/or the MEMS thermally conductive layer 42), optionally the thin MEMS handle substrate 90 (not shown), the stop layer 24, and the through-via structure 28 (the MEMS through-via 28-A and the controller through-via 28-B). In a desire case, there is no portion of the MEMS handle substrate 90 remained, such that, silicon crystal, which has no germanium, nitrogen, or oxygen content, does not exist between the MEMS device region 22 and the controller device region 44. Each of the MEMS barrier layer 40, the MEMS thermally conductive layer 42, and the MEMS bonding layer 16-A is formed of silicon composite.

Figure 7:
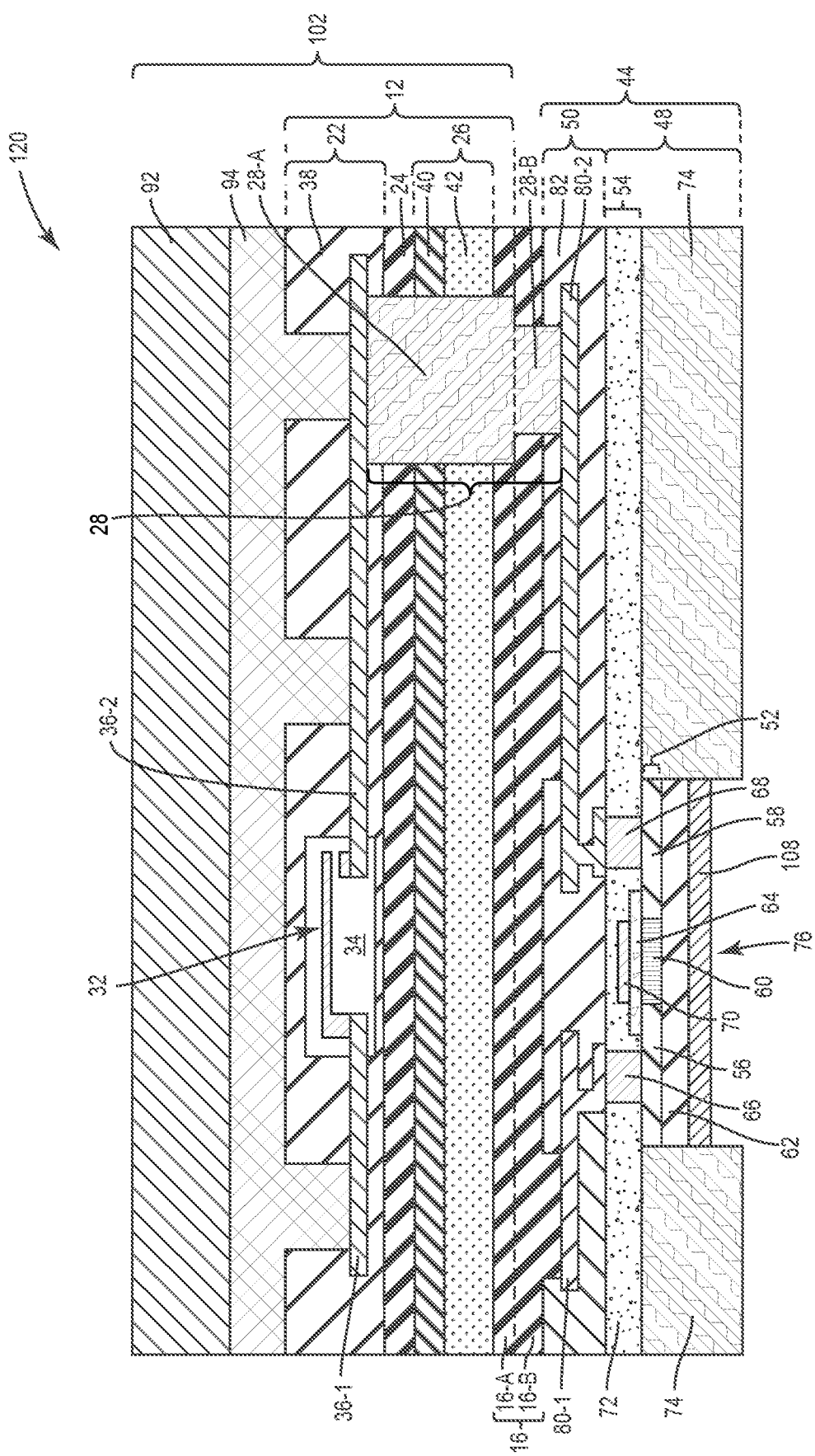

The controller handle substrate 110 is then selectively removed to provide an etched package 120, as illustrated in FIG. 7. Since the controller handle substrate 110 and the interfacial layer 108 have different germanium concentrations, they may have different reactions to a same etching technique (for instance: different etching speeds with a same etchant). Consequently, the etching system may be capable of identifying the presence of the interfacial layer 108 (presence of germanium), and capable of indicating when to stop the etching process. As such, the selective removal stops at or into the interfacial layer 108. Removing the controller handle substrate 110 may be provided by a mechanical grinding process and an etching process or provided by the etching system itself. As an example, the controller handle substrate 110 may be ground to a thinner thickness to reduce the following etching time. An etching process is then performed to remove the remaining controller handle substrate 110. The etching process may be provided by a wet etching system with an etchant chemistry, which is at least one of TMAH, KOH, NaOH, ACH, and $XeF_2$, or a dry etching system, such as a reactive ion etching system with a chlorine-based gas chemistry or a fluorine-based gas chemistry. If the isolation sections 74 extend vertically beyond the interfacial layer 108, the removal of the controller handle substrate 110 will provide the opening 76 underneath the interfacial layer 108 (of course underneath the active layer 52) and within the isolation sections 74. During the removal process, the isolation sections 74 are not removed and protect sides of the active layer 52.

Figure 8:
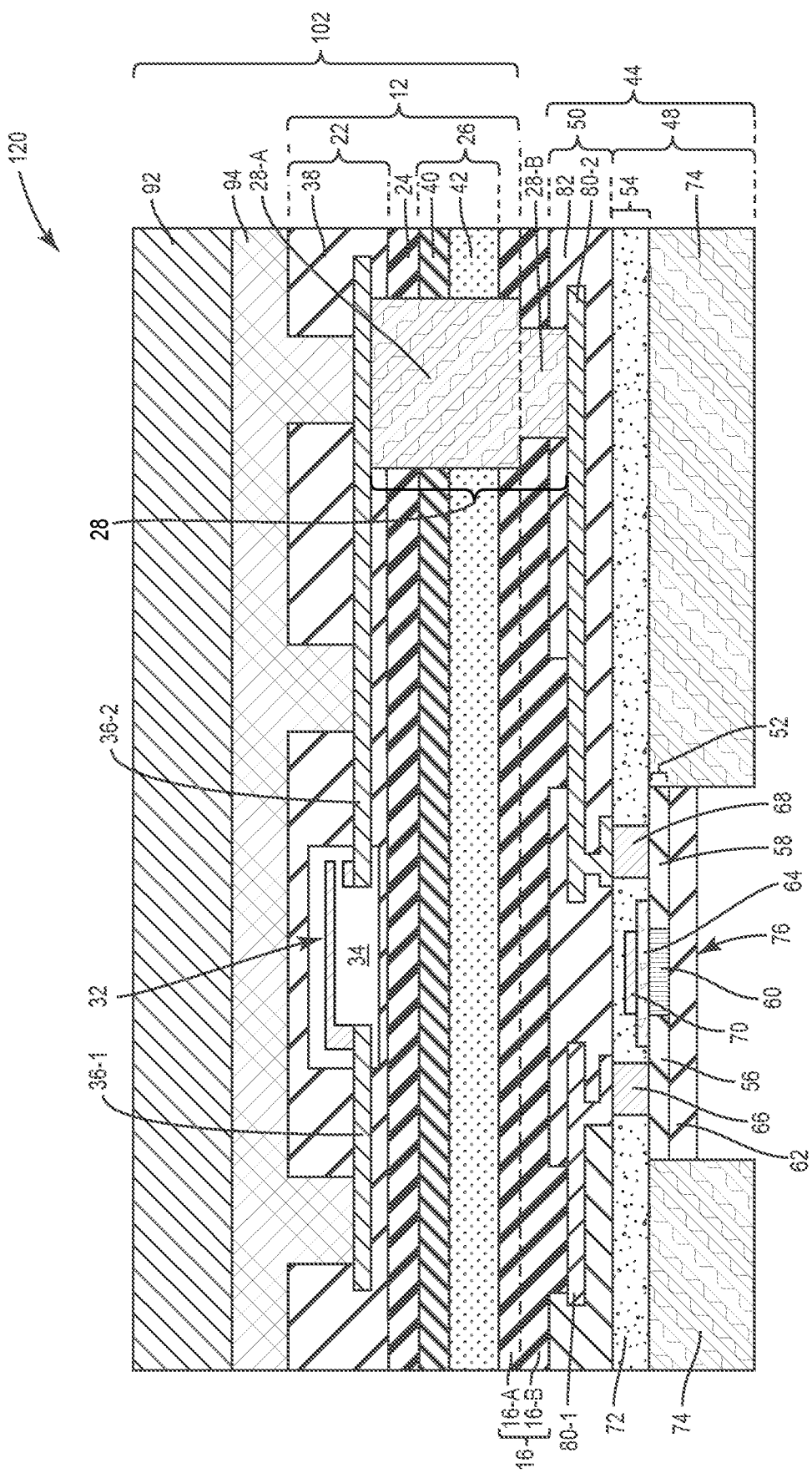

Due to the narrow gap nature of the SiGe material, it is possible that the interfacial layers 108 may be conductive (for some type of devices). The interfacial layers 108 may cause current leakage between the source 56 and the drain 58 of the FEOL portion 48. Therefore, in some applications, such as FET switch applications, it is desirable to also remove the interfacial layers 108, as illustrated in FIG. 8. If the body 62 exists underneath the active layer 52, the body 62 will be exposed at the opening 76. The interfacial layers 108 may be removed by the same etching process used to remove the controller handle substrate 110, or may be removed by another etching process, such as a chlorine-base dry etching system (Chlorine or fluorine-based) and/or a wet etching (using TMAH, NH4OH:H2O2, H2O2, etc.). Herein, if the interfacial layer 108 is thin enough, it may not cause any leakage between the source 56 and the drain 58 of the FEOL portion 48. In that case, the interfacial layers 108 may remain (not shown).

Figure 9:
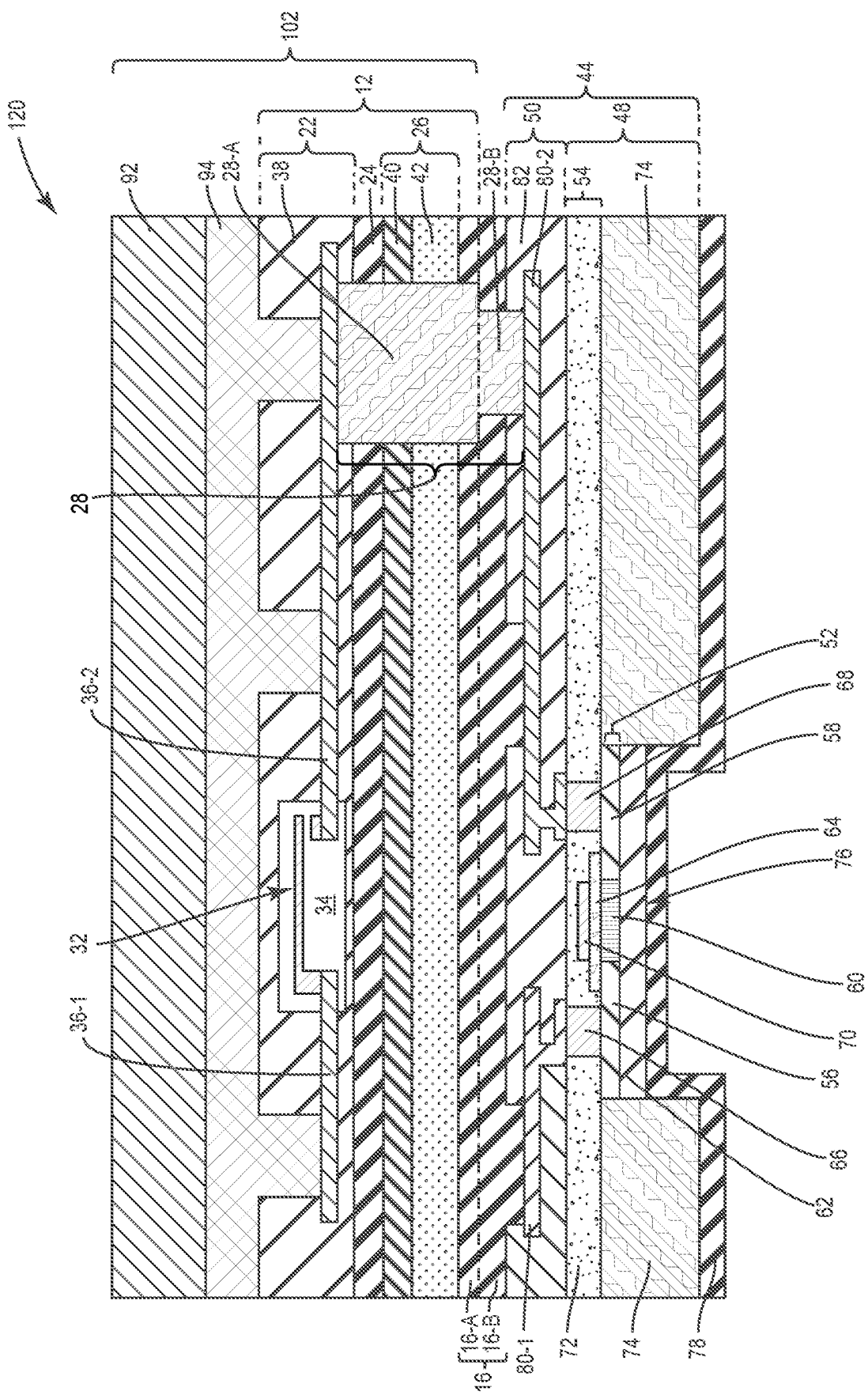

In some applications, after the removal of the controller handle substrate 110 and the interfacial layer 108, the active layer 52 may be passivated to achieve further low levels of current leakage in the device. The passivation layer 78 may be formed directly underneath the FEOL portion 48 of the controller device region 44, as illustrated in FIG. 9. Herein, the passivation layer 78 may extend over an entire bottom surface of the FEOL portion 48, such that the passivation layer 78 continuously covers exposed surfaces within the opening 76 and bottom surfaces of the isolation sections 74. In some applications, the passivation layer 78 may only cover the bottom surface of the active layer 52 (covers the bottom surface of the body 62 if the body 62 exists) and resides within the opening 76 without covering the bottom surfaces of the isolation sections 74 (not shown). The passivation layer 78 may be formed of silicon oxide by a plasma enhanced deposition process, an anodic oxidation process, an ozone-based oxidation process, and a number of other proper techniques.

Figure 10:
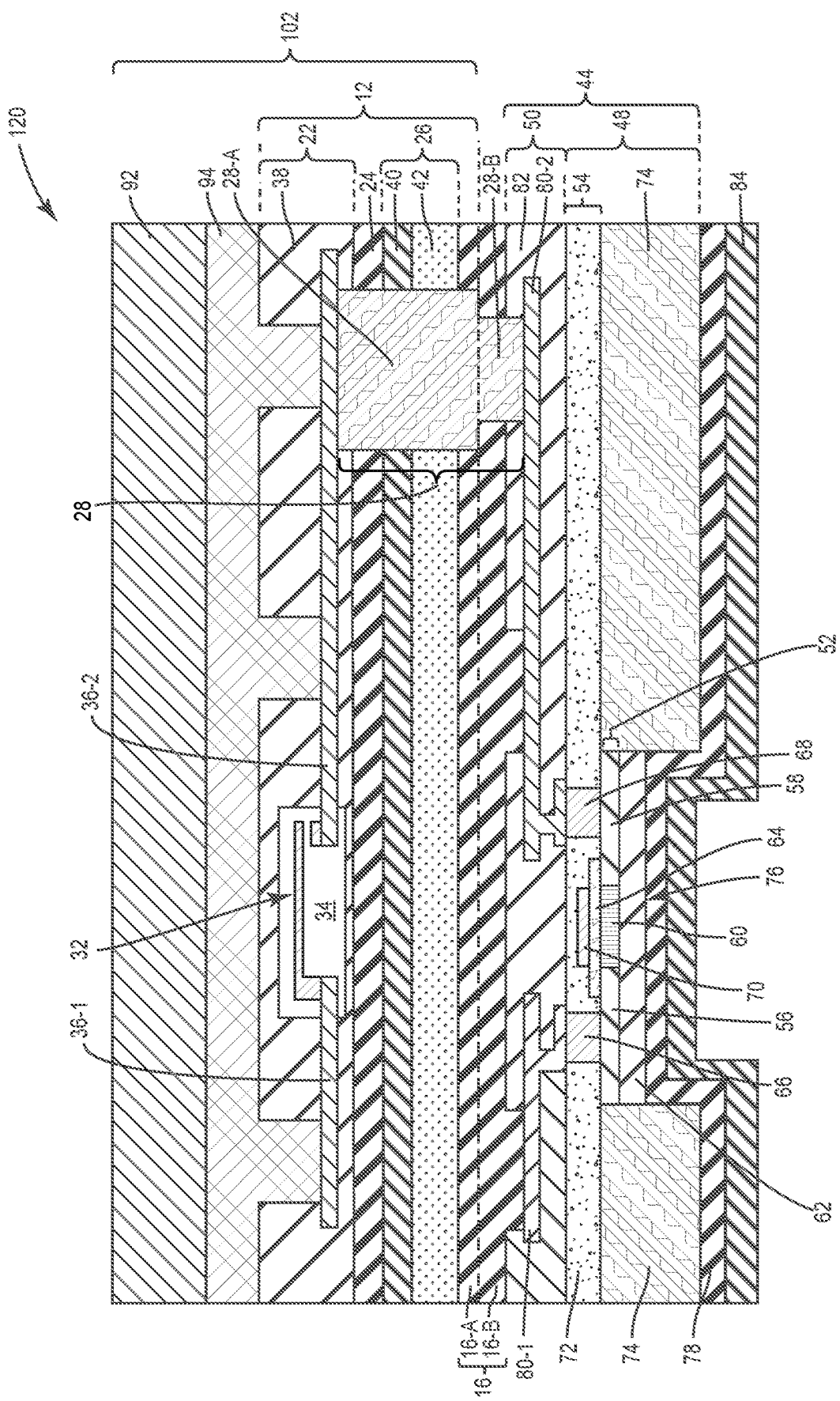

Next, the controller barrier layer 84 is applied directly underneath the passivation layer 78, as illustrated in FIG. 10. The controller barrier layer 84 is configured to provide a superior barrier to moisture and impurities, which could diffuse into the channel 60 of the active layer 52 and cause reliability concerns in the device. In addition, the controller barrier layer 84 may also be engineered so as to provide additional tensile strain to the controller device region 44. Such strain may be beneficial in providing additional improvement of electron mobility in n-channel devices. If the passivation layer 78 is formed only with the opening 76, the controller barrier layer 84 continuously covers exposed surfaces within the opening 76 (at the bottom surface of the passivation layer 78 and side surface portions of the isolation sections 74) and bottom surfaces of the isolation sections 74 (not shown). In some applications, the controller barrier layer 84, which is formed of silicon nitride with a thickness between 2000 Å and 10 μm, may further passivate the active layer 52. In such case, there may be no need for the passivation layer 78. The controller barrier layer 84 always extends over the bottom surface of the active layer 52. The controller barrier layer 84 may be formed by a chemical vapor deposition system such as a PECVD system, or an ALD system, such as a PEALD system.

Figure 11:
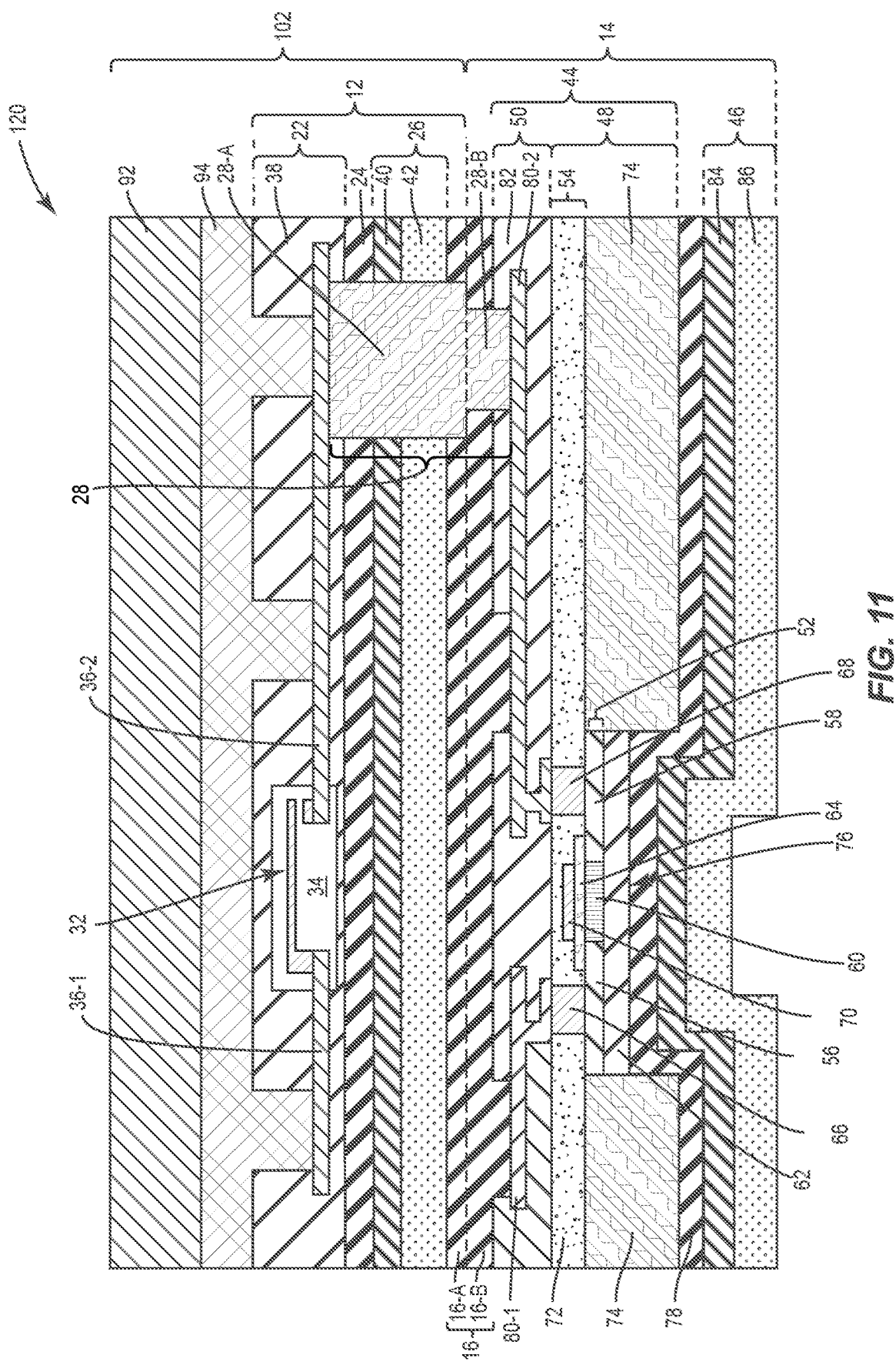

The controller thermally conductive layer 86 is then applied underneath the controller barrier layer 84 to form the controller enhancement region 46 so as to complete the controller device 14, as illustrated in FIG. 11. The controller thermally conductive layer 86, which may be formed of aluminum nitride with a thickness between 0.1 μm and 20 μm, is configured to provide superior thermal dissipation for the controller device region 44, in the order of 275 W/mk while retaining superior electrically insulating characteristics. The controller thermally conductive layer 86 might be very important to the overall thermal behavior of the stacked layers. If power dissipation is not of a concern, then the controller thermally conductive layer 86 may be omitted. The controller thermally conductive layer 86 may be formed by CVD, ALD, or other similar methods known to those skilled in the art of semiconductor processing.

Figure 12:
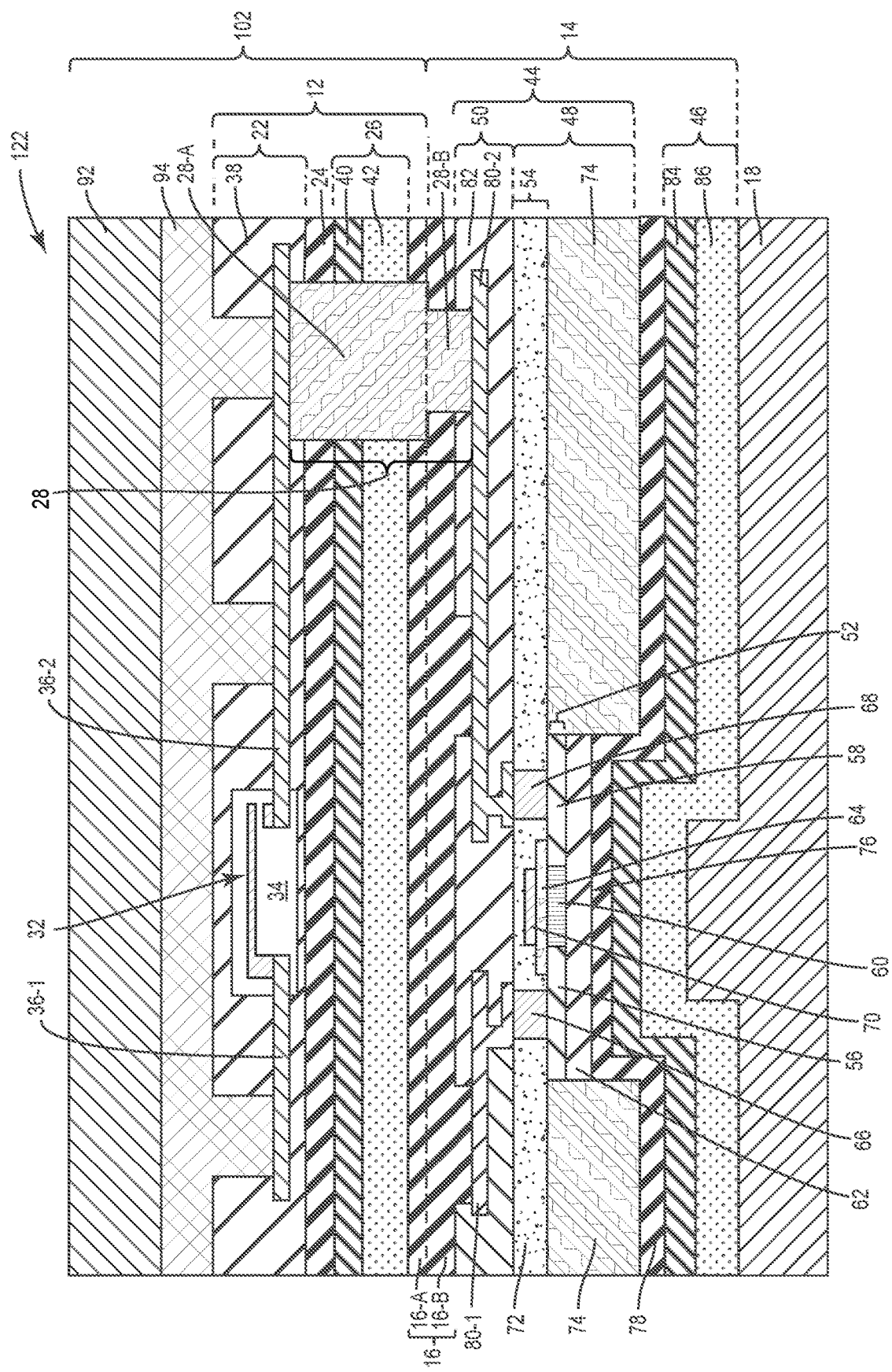

After the controller enhancement region 46 is formed, the mold compound 18 is applied underneath the controller enhancement region 46 to provide a molded package 122, as illustrated in FIG. 12. Herein, the mold compound 18 fills the opening 76 and fully covers the controller enhancement region 46. The mold compound 18 may be applied by various procedures, such as compression molding, sheet molding, overmolding, transfer molding, dam fill encapsulation, and screen print encapsulation. The mold compound 18 may have a superior thermal conductivity between 1 W/m·K and 100 W/m·K, or between 7 W/m·K and 20 W/m·K. The mold compound 18 may have a dielectric constant less than 8, or between 3 and 5. During the molding process of the mold compound 18, the temporary carrier 92 provides mechanical strength and rigidity to the package. A curing process (not shown) is then performed to harden the mold compound 18. The curing temperature is between 100° C. and 320° C. depending on which material is used as the mold compound 18. After the curing process, the mold compound 18 may be thinned and/or planarized (not shown).

Figure 13:
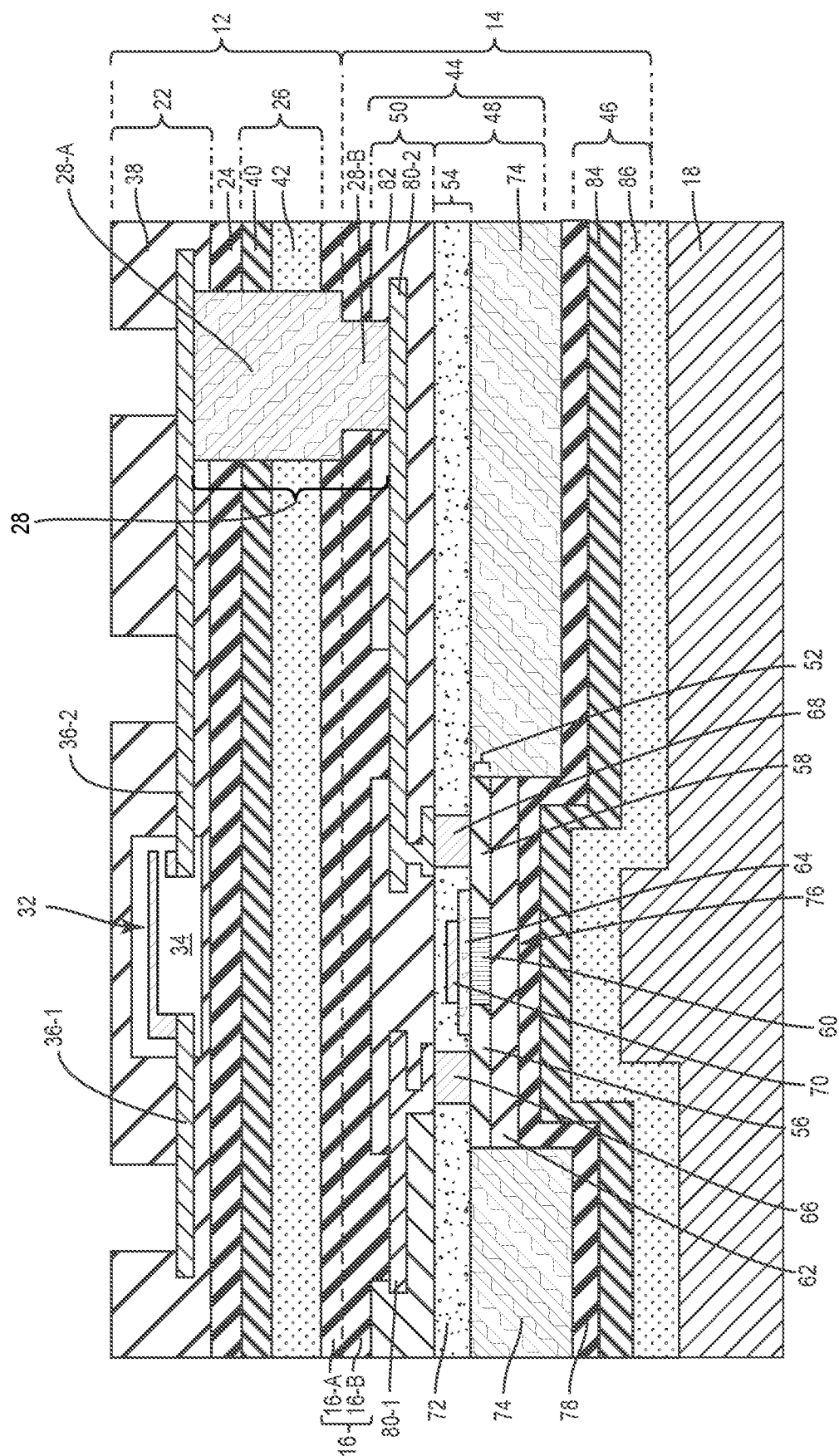

The temporary carrier 92 is then debonded from the molded package 122, and the mounting layer 94 is cleaned from the molded package 122, as illustrated in FIG. 13. A number of debonding processes and cleaning processes may be applied depending on the nature of the temporary carrier 92 and the mounting layer 94 chosen in the earlier steps. For instance, the temporary carrier 92 may be mechanically debonded using a lateral blade process with the stack heated to a proper temperature. Other suitable processes involve radiation of UV light through the temporary carrier 92 if it is formed of a transparent material, or chemical debonding using a proper solvent. The mounting layer 76 may be eliminated by wet or dry etching processes, such as proprietary solvents and plasma washing. After the debonding and cleaning process, top portions of the MEMS device region 22 are exposed. In one embodiment, one top surface portion of the first MEMS connecting layer 36-1 and two surface portions of the second MEMS connecting layer 36-2 are exposed through the MEMS dielectric layers 38, which may function as input/output (I/O) ports of the molded package 122. As such, the molded package 122 may be electrically verified to be working properly at this point.

Figure 14:
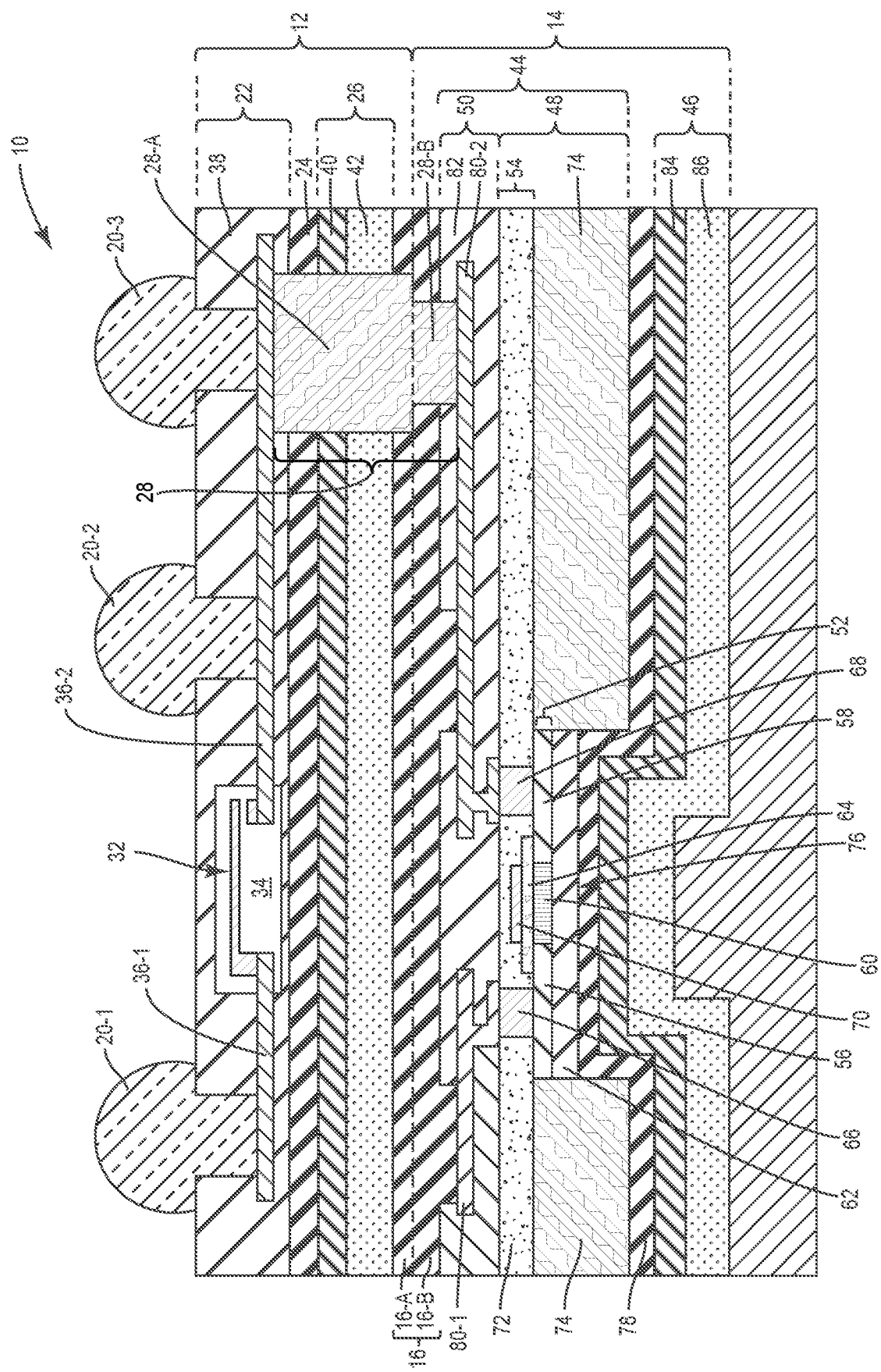

At last, a number of the bump structures 20 are formed to provide the microelectronics package 10, as illustrated in FIG. 14. Each bump structure 20 is formed at the top of the microelectronics package 10 and electrically coupled to an exposed top portion of the MEMS corresponding connecting layer 36 through the MEMS dielectric layers 38. For the purpose of this illustration, the first bump structure 20-1 is connected to the MEMS component 32 through the first MEMS connecting layer 36-1, while the second bump structure 20-2 and the third bump structure 20-3 are connected to the MEMS component 32 through the second MEMS connecting layer 36-2. In addition, the second bump structure 20-2 and the third bump structure 20-3 are connected to the FET provided in the controller device region 44 through the second MEMS connecting layer 36-2, the through-via structure 28, and the second controller connecting layer 80-2. In addition, each bump structure 20 protrudes vertically from the MEMS dielectric layers 38.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a microelectromechanical systems (MEMS) device comprising a MEMS device region and a stop layer underneath the MEMS device region, wherein the MEMS device region includes a MEMS component and a MEMS connecting layer;
a controller device, which is vertically stacked underneath the MEMS device, comprising a controller bonding layer configured to bond to the MEMS device and a controller device region underneath the controller bonding layer, wherein the controller device region includes a controlling component and a controller connecting layer; and
a through-via structure, which extends from the MEMS device region, at least extends through the stop layer and the controller bonding layer, and extends into the controller device region, wherein:
the MEMS connecting layer is configured to electrically connect the MEMS component with the through-via structure, and the controller connecting layer is configured to electrically connect the controlling component with the through-via structure, such that the controlling component in the controller device region is configured to control the MEMS component in the MEMS device region through the controller connecting layer, the through-via structure, and the MEMS connecting layer.

2. The apparatus of claim 1 wherein the through-via structure does not extend toward or into portions of the MEMS device region where the MEMS component is located, and does not extend toward or into portions of the controller device region where the controlling component is located.

3. The apparatus of claim 1 wherein:
silicon crystal, which has no germanium, nitrogen, or oxygen content, does not exist between the MEMS device region and the controller device region;
the stop layer in the MEMS device is formed of silicon oxide, and the controller bonding layer is formed of silicon oxide; and
the stop layer is directly bonded with the controller bonding layer of the controller device.

4. The apparatus of claim 1 wherein the MEMS device further includes a MEMS enhancement region underneath the stop layer and a MEMS bonding layer underneath the MEMS enhancement region, wherein:
the through-via structure extends through the MEMS bonding layer, the MEMS enhancement region, the stop layer and into the MEMS device region;
the MEMS enhancement region includes at least one of a MEMS barrier layer and a MEMS thermally conductive layer;
the MEMS bonding layer is formed of silicon oxide, and the controller bonding layer is formed of silicon oxide; and
the MEMS bonding layer and the controller bonding layer are bonded directly together to form a bonding region.

5. The apparatus of claim 4 wherein:
the MEMS enhancement region includes the MEMS barrier layer underneath the stop layer and the MEMS thermally conductive layer underneath the MEMS barrier layer;
the MEMS barrier layer is formed of silicon nitride with a thickness between 0.2 µm and 10 µm; and
the MEMS thermally conductive layer is formed of aluminum nitride with a thickness between 0.1 µm and 20 µm.

6. The apparatus of claim 4 wherein between the stop layer and the MEMS enhancement region, there is a MEMS handle substrate with a thickness between 0 µm to 50 µm.

7. The apparatus of claim 4 wherein silicon crystal, which has no germanium, nitrogen, or oxygen content, does not exist between the MEMS device region and the controller device region.

8. The apparatus of claim 1 wherein the MEMS device region further comprises a MEMS cavity, MEMS dielectric layers, and a plurality of MEMS connecting layers that includes said MEMS connecting layer, wherein:
the MEMS cavity is formed within the MEMS dielectric layers, and the MEMS component is located in the MEMS cavity, such that the MEMS component can be free to actuate; and
the plurality of MEMS connecting layers is partially covered by the MEMS dielectric layers and is configured to electrically connect the MEMS component to components outside the MEMS device region.

9. The apparatus of claim 8 further comprises a plurality of bump structures, which is formed over the MEMS device region, and electrically coupled to the MEMS component through the plurality of MEMS connecting layers.

10. The apparatus of claim 1 wherein the controller device region includes a back-end-of-line (BEOL) portion underneath the controller bonding layer, and a front-end-of-line (FEOL) portion underneath the BEOL portion, wherein:
the FEOL portion comprises a contact layer underneath the BEOL portion, an active layer underneath the contact layer, and isolation sections underneath the contact layer and surrounding the active layer, wherein a combination of the active layer and the contact layer provides the controlling component; and
the BEOL portion comprises controller dielectric layers, and a plurality of controller connecting layers that includes said controller connecting layer, wherein the plurality of controller connecting layers is partially covered by the controller dielectric layers and is configured to electrically connect the controlling component in the FEOL portion to components outside the controller device region.

11. The apparatus of claim 10 wherein the isolation sections extend vertically beyond a bottom surface of the active layer to define an opening within the isolation sections and underneath the active layer.

12. The apparatus of claim 11 wherein the controller device further includes a controller enhancement region underneath the FEOL portion of the controller device region, wherein:

the controller enhancement region includes at least one of a controller barrier layer and a controller thermally conductive layer; and the controller enhancement region continuously covers bottom surfaces of the isolation sections and exposed surfaces within the opening so as to cover the active layer.

13. The apparatus of claim 11 wherein the controller device further includes a passivation layer underneath the FEOL portion of the controller device region, wherein:

the passivation layer continuously covers bottom surfaces of the isolation sections and exposed surfaces within the opening so as to cover the active layer; and the passivation layer is formed of silicon dioxide.

14. The apparatus of claim 13 further comprises a mold compound formed underneath the passivation layer, wherein the mold compound has a thermal conductivity greater than 1 W/m·K and a dielectric constant less than 8.

15. The apparatus of claim 13 wherein the controller device further includes a controller enhancement region underneath the passivation layer, wherein the controller enhancement region includes at least one of a controller barrier layer and a controller thermally conductive layer.

16. The apparatus of claim 15 wherein:

the controller enhancement region includes the controller barrier layer underneath the passivation layer and the controller thermally conductive layer underneath the controller barrier layer;

the controller barrier layer is formed of silicon nitride with a thickness between 0.2 μm and 10 μm; and the controller thermally conductive layer is formed of aluminum nitride with a thickness between 0.1 μm and 20 μm.

17. The apparatus of claim 15 further comprises a mold compound formed underneath the controller enhancement region, wherein the mold compound has a thermal conductivity greater than 1 W/m·K and a dielectric constant less than 8.

18. The apparatus of claim 10 wherein a bottom surface of each isolation section and the bottom surface of the active layer are coplanar, such that the FEOL portion of the controller device region has a flat bottom surface.

19. The apparatus of claim 18 wherein the controller device further includes an oxide layer underneath the FEOL portion of the controller device region, wherein:

the oxide layer continuously covers bottom surfaces of the isolation sections and the active layer; and the oxide layer is formed of silicon dioxide.

20. The apparatus of claim 19 wherein the controller device further includes a controller enhancement region underneath the passivation layer, wherein the controller enhancement region includes at least one of a controller barrier layer and a controller thermally conductive layer.

21. The apparatus of claim 11 wherein the FEOL portion further comprises a body for the controlling component, which fills the opening and extends underneath the bottom surfaces of the isolation sections.

22. The apparatus of claim 21 wherein the controller device further includes a controller enhancement region underneath the body, wherein the controller enhancement region includes at least one of a controller barrier layer and a controller thermally conductive layer.

23. The apparatus of claim 1 wherein the controlling component is a switch field-effect transistor (FET).

24. The apparatus of claim 1 wherein the through-via structure is formed of copper.

\* \* \* \* \*